United States Patent
Mizuno et al.

(10) Patent No.: US 11,390,752 B2
(45) Date of Patent: Jul. 19, 2022

(54) COLORING COMPOSITION, CURED FILM, PATTERN FORMING METHOD, COLOR FILTER, SOLID-STATE IMAGING ELEMENT, AND IMAGE DISPLAY DEVICE

(71) Applicant: FUJIFILM Corporation, Tokyo (JP)

(72) Inventors: Akio Mizuno, Haibara-gun (JP); Hidekazu Oohashi, Haibara-gun (JP); Masahiro Mori, Haibara-gun (JP); Hiromu Koizumi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/821,057

(22) Filed: Mar. 17, 2020

(65) Prior Publication Data

US 2020/0239694 A1  Jul. 30, 2020

Related U.S. Application Data

(63) Continuation of application No. PCT/JP2018/033896, filed on Sep. 13, 2018.

(30) Foreign Application Priority Data

Sep. 20, 2017 (JP) .............................. JP2017-180317

(51) Int. Cl.
*C09B 57/00* (2006.01)
*C08F 220/34* (2006.01)
*C09B 67/00* (2006.01)
*G03F 7/00* (2006.01)

(52) U.S. Cl.
CPC .......... *C09B 57/004* (2013.01); *C08F 220/34* (2013.01); *C09B 68/441* (2013.01); *C09B 68/443* (2013.01); *C09B 68/444* (2013.01); *C09B 68/446* (2013.01); *G03F 7/0007* (2013.01)

(58) Field of Classification Search
None
See application file for complete search history.

(56) References Cited

U.S. PATENT DOCUMENTS

| 4,415,685 | A | * | 11/1983 | Iqbal | .................... C07D 487/04 524/92 |
| 2010/0032657 | A1 | | 2/2010 | Yanai et al. | |
| 2011/0155973 | A1 | * | 6/2011 | Lenz | ...................... G02B 5/223 252/586 |
| 2012/0235099 | A1 | * | 9/2012 | Ushijima | .................. C09B 5/14 252/586 |

FOREIGN PATENT DOCUMENTS

| JP | 2009-149707 A | 7/2009 |
| JP | 2010-037392 A | 2/2010 |
| JP | 2011-523433 A | 8/2011 |
| JP | 2013-161026 A | 8/2013 |
| JP | 2013-186146 A | 9/2013 |
| WO | 2005/039515 A1 | 5/2005 |
| WO | 2008/044302 A1 | 4/2008 |

OTHER PUBLICATIONS

Office Action dated Mar. 16, 2021 from the Japanese Patent Office in Japanese Application No. 2019-543590.
Office Action dated Jan. 12, 2021 from the Taiwanese Intellectual Property Office in TW Application No. 107132683.
Office Action dated Jan. 18, 2021 from the Korean Intellectual Property Office in KR Application No. 10-2020-7007732.
International Search Report dated Dec. 11, 2018 in International Application No. PCT/JP2018/033896.
Written Opinion of the International Searching Authority dated Dec. 11, 2018 in International Application No. PCT/JP2018/033896.
International Preliminary Report on Patentability dated Mar. 24, 2020 in International Application No. PCT/JP2018/033896.

\* cited by examiner

*Primary Examiner* — Joseph R Kosack
(74) *Attorney, Agent, or Firm* — Sughrue Mion, PLLC

(57) ABSTRACT

Provided is a coloring composition capable of forming a cured film having desired spectral characteristics even for thin-film. In addition, provided are a cured film, a pattern forming method, a color filter, a solid-state imaging element, and an image display device. The coloring composition contains: a pigment A having a structure in which an aromatic ring group into which a group with an oxygen atom, a sulfur atom, or a nitrogen atom bonded to an aromatic ring is introduced is bonded to a diketopyrrolopyrrole skeleton; and a compound having a curable group. A content of the pigment A in a total solid content of the coloring composition is 40% by mass or more.

15 Claims, No Drawings

COLORING COMPOSITION, CURED FILM, PATTERN FORMING METHOD, COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2018/033896 filed on Sep. 13, 2018, which claims priority under 35 U.S.C § 119(a) to Japanese Patent Application No. 2017-180317 filed on Sep. 20, 2017. Each of the above application(s) is hereby expressly incorporated by reference, in its entirety, into the present application.

BACKGROUND OF THE INVENTION

1. Field of the Invention

The present invention relates to a coloring composition. More specifically, the present invention relates to a coloring composition including a pigment having a diketopyrrolopyrrole skeleton. The present invention further relates to a cured film, a pattern forming method, a color filter, a solid-state imaging element, and an image display device, each of which uses the coloring composition.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element. The color filter normally includes pixels (coloring patterns) of three primary colors of red, green, and blue, and acts to separate transmitted light into the three primary colors.

A diketopyrrolopyrrole pigment such as Color Index Pigment Red 254 is used as a coloring composition for forming a red pixel (see JP2010-037392A).

WO2008/044302A discloses an invention relating to an organic transistor having a thin-film formed using an organic semiconductor. A compound having a diketopyrrolopyrrole skeleton is exemplified as a kind of the organic semiconductor.

SUMMARY OF THE INVENTION

In recent years, the color filter has been required to have high resolution and to achieve a reduction in film thickness. In examples of JP2010-037392A, a red colored layer of a red filter of 2.0 μm is formed using a coloring composition containing Color Index Pigment Red 254, but a further reduction in film thickness has been desired in recent years.

Examples of means for achieving a reduction in film thickness while maintaining desired spectral characteristics of a color filter include a method of increasing the concentration of a colorant in a coloring composition which is used for forming a color filter. However, in a case where the concentration of the colorant is increased, it is required to reduce components other than the colorant, and thus troubles occur in film forming properties, pattern formability, and the like, or the degree of freedom in formulation design is decreased.

In WO2008/044302A, a compound having a diketopyrrolopyrrole skeleton is exemplified as a kind of organic semiconductor. However, WO2008/044302A includes no description or suggestion with regard to a coloring composition containing a compound having a diketopyrrolopyrrole skeleton and a compound having a curable group.

Therefore, an object of the present invention is to provide a coloring composition capable of forming a cured film having desired spectral characteristics even for thin-film.

Another object of the present invention is to provide a cured film, a pattern forming method, a color filter, a solid-state imaging element, and an image display device.

According to the studies conducted by the present inventors, it was found that the above object can be achieved by using a coloring composition as described later, thereby leading to completion of the present invention. The present invention provides the following aspects.

<1> A coloring composition comprising: a pigment A having a structure in which an aromatic ring group in which a group bonded with an oxygen atom, a sulfur atom, or a nitrogen atom is introduced to an aromatic ring is bonded to a diketopyrrolopyrrole skeleton; and a compound having a curable group, in which a content of the pigment A in a total solid content of the coloring composition is 40% by mass or more.

<2> The coloring composition as described in <1>, in which the aromatic ring group is a group represented by Formula (AR-1), Formula (AR-1)

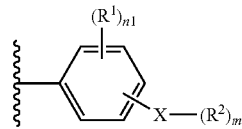

in the formula, $R^1$ represents a substituent, $R^2$ represents a hydrogen atom, an alkyl group, an aryl group, or a heteroaryl group, n1 represents an integer of 0 to 4, X represents an oxygen atom, a sulfur atom, or a nitrogen atom, in a case where X represents an oxygen atom or a sulfur atom, m represents 1, and in a case where X represents a nitrogen atom, m represents 2, and the wavy line represents a bonding site with the diketopyrrolopyrrole skeleton.

<3> The coloring composition as described in <1> or <2>, in which the pigment A is a compound represented by Formula (1),

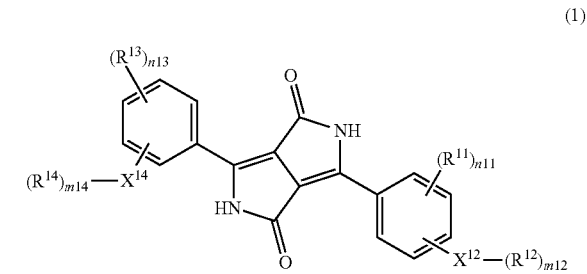

in the formula, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ represents an oxygen atom or a sulfur atom, m12 represents 1, and in a case where $X^{12}$ represents a nitrogen atom, m12 represents 2, and in a case where $X^{14}$ represents an oxygen atom or a sulfur atom, m14 represents 1, and in a case where $X^{14}$ represents a nitrogen atom, m14 represents 2.

<4> The coloring composition as described in <1> or <2>, in which the pigment A is a compound represented by Formula (2),

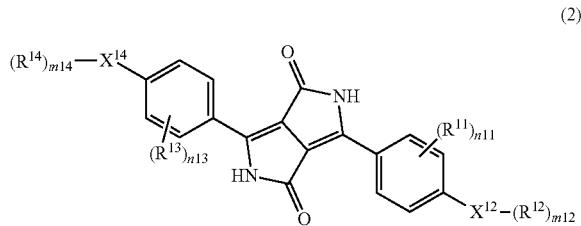

(2)

in the formula, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ represents an oxygen atom or a sulfur atom, m12 represents 1, and in a case where $X^{12}$ represents a nitrogen atom, m12 represents 2, and in a case where $X^{14}$ represents an oxygen atom or a sulfur atom, m14 represents 1, and in a case where $X^{14}$ represents a nitrogen atom, m14 represents 2.

<5> The coloring composition as described in any one of <1> to <4>, in which the compound having a curable group includes at least one compound selected from a compound having an ethylenically unsaturated group and a compound having an epoxy group.

<6> The coloring composition as described in any one of <1> to <5>, in which the compound having a curable group includes a resin having an ethylenically unsaturated group.

<7> The coloring composition as described in any one of <1> to <6>, in which the compound having a curable group includes a compound having an ethylenically unsaturated group and further includes a photopolymerization initiator.

<8> The coloring composition as described in any one of <1> to <7>, further comprising: a monomer having an ethylenically unsaturated group; and a resin, in which a ratio M1/B1 of a mass M1 of the monomer having an ethylenically unsaturated group contained in the coloring composition to a mass B1 of the resin contained in the coloring composition is 0.2 or less.

<9> A cured film obtained from the coloring composition as described in any one of <1> to <8>.

<10> A pattern forming method comprising:

a step of forming a coloring composition layer on a support using the coloring composition as described in any one of <1> to <8>; and a step of forming a pattern onto the coloring composition layer by a photolithography method or a dry etching method.

<11> A color filter comprising the cured film as described in <9>.

<12> A solid-state imaging element comprising the cured film as described in <9>.

<13> An image display device comprising the cured film as described in <9>.

According to the present invention, it is possible to provide a coloring composition capable of forming a cured film having desired spectral characteristics even for thin-film. It is also possible to provide a cured film, a pattern forming method, a color filter, a solid-state imaging element, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, or electron beams.

In the present specification, a numerical range expressed using "to" means a range that includes the preceding and succeeding numerical values of "to" as the lower limit value and the upper limit value, respectively.

In the present specification, the total solid content refers to a total amount of the components other than a solvent from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, the term "step" not only means an independent step, but also includes a step which is not clearly distinguished from other steps in a case where an intended action of the step is obtained.

In the present specification, a weight-average molecular weight (Mw) and a number-average molecular weight (Mn) are each defined as a value in terms of polystyrene through measurement by means of gel permeation chromatography (GPC).

<Coloring Composition>

A coloring composition of the embodiment of the present invention includes:

a pigment A having a structure in which an aromatic ring group in which a group bonded with an oxygen atom, a sulfur atom, or a nitrogen atom is introduced to an aromatic ring is bonded to a diketopyrrolopyrrole skeleton; and a compound having a curable group, and a content of the pigment A in a total solid content of the coloring composition is 40% by mass or more.

The coloring composition of the embodiment of the present invention includes 40% by mass or more of the pigment A with respect to the total solid content of the coloring composition. However, since the pigment A has a higher red color value than red pigments in the related art, it is possible to form a cured film having desired spectral characteristics even for a thin-film. It is presumed that since the pigment A has a structure in which an aromatic ring group with the above-described group introduced thereinto is bonded to the diketopyrrolopyrrole skeleton, a Highest Occupied Molecular Orbital (HOMO)-Lowest Unoccupied Molecular Orbital (LUMO) transition extends, the transition moment thus increases, and as a result, due to an increase of molar absorption coefficient c in a red wavelength range (for example, 450 to 600 nm) of the pigment A, the red color value is high.

In addition, since the pigment A has a higher red color value than the red pigments in the related art, desired spectral characteristics can be achieved with a smaller formulation amount than a formulation amount required to achieve the same spectral characteristics as the red pigments in the related art. Thus, formulation amounts of components other than the pigment can also be increased, and the degree of freedom in formulation design is high.

In addition, the pigment A also has excellent dispersibility in the composition. It is presumed that since a group bonded with an oxygen atom, a sulfur atom, or a nitrogen atom is introduced to an aromatic ring in the aromatic ring group of the pigment A, a n electron density on the aromatic ring increases, and thus interactive properties with a dispersant or the like is improved.

Hereinafter, the respective components used for the coloring composition of the embodiment of the present invention will be described.

<<Pigment A>>

The coloring composition of the embodiment of the present invention contains a pigment A having a structure in which an aromatic ring group in which a group bonded with an oxygen atom, a sulfur atom, or a nitrogen atom is introduced to an aromatic ring is bonded to a diketopyrrolopyrrole skeleton. The pigment is a pigment having a diketopyrrolopyrrole skeleton.

The aromatic ring group is preferably a group represented by Formula (AR-1).

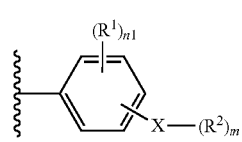

Formula (AR-1)

In the formula, $R^1$ represents a substituent, $R^2$ represents a hydrogen atom, an alkyl group, an aryl group, or a heteroaryl group, n1 represents an integer of 0 to 4, X represents an oxygen atom, a sulfur atom, or a nitrogen atom, in a case where X represents an oxygen atom or a sulfur atom, m represents 1, and in a case where X represents a nitrogen atom, m represents 2, and the wavy line represents a bonding site with the diketopyrrolopyrrole skeleton.

In Formula (AR-1), examples of the substituent represented by $R^1$ include groups in the description of a substituent T to be described later, and preferred specific examples thereof include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In Formula (AR-1), $R^2$ represents a hydrogen atom, an alkyl group, an aryl group, or a heteroaryl group. The alkyl group represented by $R^2$ preferably has 1 to 20 carbon atoms, more preferably has 1 to 15 carbon atoms, and still more preferably has 1 to 8 carbon atoms. The alkyl group may be any of linear, branched, and cyclic forms, and are preferably linear or branched. The alkyl group may have a substituent. Examples of the substituent include groups in the description of the substituent T to be described later. The aryl group represented by $R^2$ preferably has 6 to 30 carbon atoms, more preferably has 6 to 20 carbon atoms, and still more preferably has 6 to 12 carbon atoms. The aryl group may have a substituent. Examples of the substituent include groups in the description of the substituent T to be described later. The heteroaryl group represented by $R^2$ may be a single ring or a fused ring. The number of heteroatoms constituting a ring of the heteroaryl group is preferably 1 to 3. It is preferable that the heteroatom constituting the ring of the heteroaryl group is a nitrogen atom, an oxygen atom, or a sulfur atom. The heteroaryl group is preferably a 5-membered ring or a 6-membered ring. The number of carbon atoms constituting the ring of the heteroaryl group is preferably 3 to 30, more preferably 3 to 18, and still more preferably 3 to 12. The heteroaryl group may have a substituent. Examples of the substituent include groups in the description of the substituent T to be described later.

In Formula (AR-1), n1 represents an integer of 0 to 4, and preferably an integer of 0 to 3, more preferably an integer of 0 to 2, still more preferably 0 or 1, and particularly preferably 0.

In Formula (AR-1), X represents an oxygen atom, a sulfur atom, or a nitrogen atom. Since the molar absorption coefficient of the pigment A at a wavelength of 500 to 600 nm can be further increased, X is preferably an oxygen atom or a nitrogen atom, and particularly preferably an oxygen atom.

In Formula (AR-1), $R^2$ is preferably a hydrogen atom or an alkyl group, and more preferably an alkyl group since the molar absorption coefficient of the pigment A at a wavelength of 500 to 600 nm can be further increased.

In Formula (AR-1), the wavy line represents a bonding site with the diketopyrrolopyrrole skeleton. The diketopyrrolopyrrole skeleton means the following structure. The wavy line represents a bonding position with the substituent such as the group represented by Formula (AR-1). Examples of the substituent other than the group represented by Formula (AR-1) include an aryl group. The aryl group may have a substituent. Examples of the substituent include groups in the description of the substituent T to be described later.

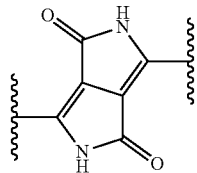 [SMILES: *C1=C2C(=O)NC(*)=C2C(=O)N1]

The pigment A is preferably a compound represented by Formula (1), and more preferably a compound represented by Formula (2) since the molar absorption coefficient thereof at a wavelength of 500 to 600 nm can be further increased.

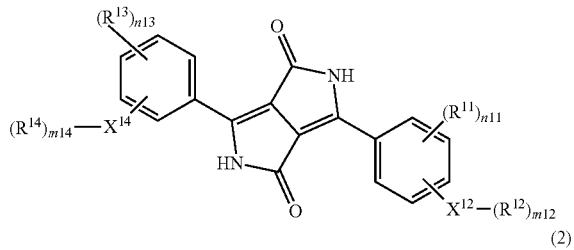

(1)

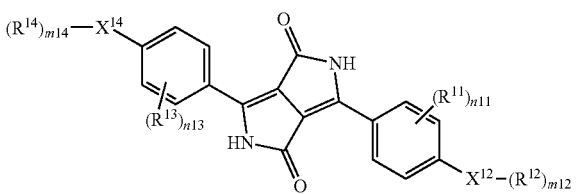

(2)

In the formula, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ represents an oxygen atom or a sulfur atom, m12 represents 1, and in a case where $X^{12}$ represents a nitrogen atom, m12 represents 2, and in a case where $X^{14}$ represents an oxygen atom or a sulfur atom, m14 represents 1, and in a case where $X^{14}$ represents a nitrogen atom, m14 represents 2.

Examples of the substituent represented by $R^{11}$ and $R^{13}$ include groups in the description of the substituent T to be described later, and preferred specific examples thereof include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

$R^{12}$ and $R^{14}$ each independently represent a hydrogen atom, an alkyl group, an aryl group, or a heteroaryl group. The alkyl group represented by $R^{12}$ and $R^{14}$ preferably has 1 to 20 carbon atoms, more preferably has 1 to 15 carbon atoms, and still more preferably has 1 to 8 carbon atoms. The alkyl group may be any of linear, branched, and cyclic forms, and are preferably linear or branched. The alkyl group may have a substituent. Examples of the substituent include groups in the description of the substituent T to be described later. The aryl group represented by $R^{12}$ and $R^{14}$ preferably has 6 to 30 carbon atoms, more preferably has 6 to 20 carbon atoms, and still more preferably has 6 to 12 carbon atoms. The aryl group may have a substituent. Examples of the substituent include groups in the description of the substituent T to be described later. The heteroaryl group represented by $R^{12}$ and $R^{14}$ may be a single ring or a fused ring. The number of heteroatoms constituting a ring of the heteroaryl group is preferably 1 to 3. It is preferable that the heteroatom constituting the ring of the heteroaryl group is a nitrogen atom, an oxygen atom, or a sulfur atom. The heteroaryl group is preferably a 5-membered ring or a 6-membered ring. The number of carbon atoms constituting the ring of the heteroaryl group is preferably 3 to 30, more preferably 3 to 18, and still more preferably 3 to 12. The heteroaryl group may have a substituent. Examples of the substituent include groups in the description of the substituent T to be described later.

n11 and n13 each independently represent an integer of 0 to 4, and preferably an integer of 0 to 3, more preferably an integer of 0 to 2, still more preferably 0 or 1, and particularly preferably 0.

$X^{12}$ and $X^{14}$ each independently represent an oxygen atom, a sulfur atom, or a nitrogen atom. $X^{12}$ and $X^{14}$ each independently preferably represent an oxygen atom or a nitrogen atom, and particularly preferably represent an oxygen atom since the molar absorption coefficient of the pigment A at a wavelength of 500 to 600 nm can be further increased.

$R^{12}$ and $R^{14}$ preferably represent a hydrogen atom or an alkyl group, and more preferably represent an alkyl group since the molar absorption coefficient of the pigment A at a wavelength of 500 to 600 nm can be further increased.

(Substituent T)

Examples of the substituent T include the following groups: an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, a acyl group (preferably an acyl group having 1 to 30 carbon atoms), an alkoxycarbonyl group (preferably an alkoxycarbonyl group having 2 to 30 carbon atoms), an aryloxycarbonyl group (preferably an alkoxycarbonyl group having 2 to 30 carbon atoms), an aryloxycarbonyl group (preferably an aryloxycarbonyl group having 7 to 30 carbon atoms), a heteroaryloxycarbonyl group, an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a hydroxy group, a carboxyl group, a sulfo group, a phosphoric acid group, a carboxylic acid amide group, a sulfonic acid amide group, an imide acid group, a mercapto group, a halogen atom, a cyano group, an alkylsulfino group, an arylsulfino group, a hydrazino group, an imino group, and a heteroaryl group (preferably having 1 to 30 carbon atoms). In a case where these groups can be further substituted, these may further have a substituent. Examples of the substituent include the groups described in the description of the substituent T.

Specific examples of the pigment A include a compound having the following structure.

In the following tables, a case where the substituent is represented by "-" indicates that the substituent is a hydrogen atom. For example, DPP-1 is a compound in which $Z^1$ and $Z^3$ to $Z^{10}$ represent a hydrogen atom, and $Z^2$ represents $-OCH_3$. In addition, Me represents a methyl group and Ph represents a phenyl group.

TABLE 1

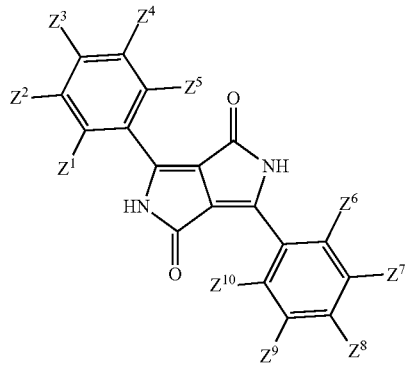

| | $Z^1$ | $Z^2$ | $Z^3$ | $Z^4$ | $Z^5$ | $Z^6$ | $Z^7$ | $Z^8$ | $Z^9$ | $Z^{10}$ |
|---|---|---|---|---|---|---|---|---|---|---|
| DPP-1 | — | —OCH$_3$ | — | — | — | — | — | — | — | — |
| DPP-2 | —OCH$_3$ | — | — | — | — | — | — | — | — | — |
| DPP-3 | — | —OCH$_3$ | — | — | — | —OCH$_3$ | — | — | — | — |
| DPP-4 | — | —OCH$_3$ | — | —Me | — | — | — | — | — | — |
| DPP-5 | — | —OCH$_3$ | — | —Cl | — | — | — | — | — | — |
| DPP-6 | — | —OCH$_3$ | — | —CN | — | — | — | — | — | — |
| DPP-7 | — | —OCH$_3$ | — | —COOMe | — | — | — | — | — | — |
| DPP-8 | — | —OCH$_3$ | — | —OCH$_3$ | — | — | — | — | — | — |
| DPP-9 | —OCH$_3$ | —OCH$_3$ | —OCH$_3$ | —OCH$_3$ | —OCH$_3$ | — | — | — | — | — |
| DPP-10 | — | —OCH$_3$ | — | —OCH$_3$ | — | — | — | —OCH$_3$ | — | — |
| DPP-11 | — | —OCH$_3$ | — | — | — | — | — | —NO$_2$ | — | — |
| DPP-12 | — | —OCH$_3$ | — | — | — | — | — | —CF$_3$ | — | — |
| DPP-13 | — | —OCH$_3$ | — | — | — | — | —Me | —Me | —Me | — |
| DPP-14 | — | —OCH$_3$ | — | — | — | —F | — | —F | — | —F |
| DPP-15 | — | —SCH$_3$ | — | — | — | — | — | — | — | — |
| DPP-16 | —SCH$_3$ | — | — | — | — | — | — | — | — | — |
| DPP-17 | — | —N(CH$_3$)$_2$ | — | — | — | — | — | — | — | — |
| DPP-18 | —N(CH$_3$)$_2$ | — | — | — | — | — | — | — | — | — |
| DPP-19 | — | —NH(CH)$_3$ | — | — | — | — | — | — | — | — |
| DPP-20 | — | —N(Ph)(CH$_3$) | — | — | — | — | — | — | — | — |

TABLE 2

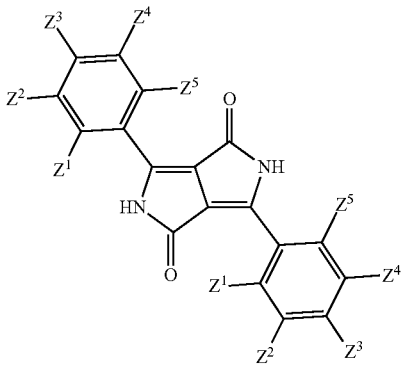

| | $Z^1$ | $Z^2$ | $Z^3$ | $Z^4$ | $Z^5$ |
|---|---|---|---|---|---|
| DPP-21 | — | —OCH$_3$ | — | — | — |
| DPP-22 | —OCH$_3$ | — | — | — | — |
| DPP-23 | — | —OH | — | — | — |
| DPP-24 | — | —OC$_5$H$_{11}$ | — | — | — |
| DPP-25 | — | —OCH$_2$CH$_2$OCH$_3$ | — | — | — |
| DPP-26 | — | —OPh | — | — | — |
| DPP-27 | — | —OCH$_3$ | — | —OCH$_3$ | — |
| DPP-28 | —OCH$_3$ | —OCH$_3$ | — | — | — |
| DPP-29 | — | —OCH$_3$ | — | —Me | — |
| DPP-30 | — | —OCH$_3$ | — | — | —F |
| DPP-31 | —OCH$_3$ | — | —Me | — | — |
| DPP-32 | —OCH$_3$ | — | —Cl | — | — |
| DPP-33 | —OCH$_3$ | — | —CN | — | — |
| DPP-34 | —OCH$_3$ | — | —COOMe | — | — |
| DPP-35 | —OCH$_3$ | — | —NO$_2$ | — | — |
| DPP-36 | —OCH$_3$ | — | —SO$_2$Me | — | — |
| DPP-37 | — | —SCH$_3$ | — | — | — |
| DPP-38 | —SCH$_3$ | — | — | — | — |
| DPP-39 | — | —SC$_5$H$_{11}$ | — | — | — |
| DPP-40 | — | —SPh | — | — | — |
| DPP-41 | — | —N(CH$_3$)$_2$ | — | — | — |
| DPP-42 | —N(CH$_3$)$_2$ | — | — | — | — |
| DPP-43 | — | —N(Ph)(CH$_3$) | — | — | — |
| DPP-44 | — | —N(Ph)$_2$ | — | — | — |
| DPP-45 | —F | —N(CH$_3$)$_2$ | — | — | — |

TABLE 3

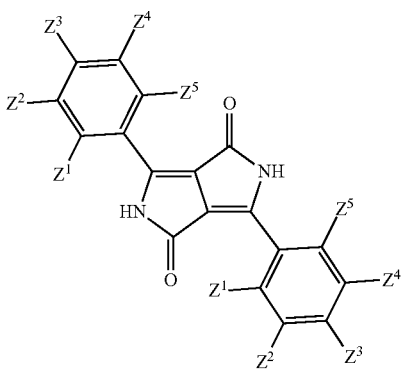

| | $Z^1$ | $Z^2$ | $Z^3$ | $Z^4$ | $Z^5$ |
|---|---|---|---|---|---|
| DPP-46 | — | — | —OCH$_3$ | — | — |
| DPP-47 | — | — | OH | — | — |
| DPP-48 | — | — | —OC$_5$H$_{11}$ | — | — |
| DPP-49 | — | — | —OCH$_2$CH$_2$OCH$_3$ | — | — |
| DPP-50 | — | — | —OPh | — | — |
| DPP-51 | — | —Me | —OCH$_3$ | — | — |
| DPP-52 | — | —Cl | —OCH$_3$ | — | — |
| DPP-53 | — | —CN | —OCH$_3$ | — | — |
| DPP-54 | — | —COOMe | —OCH$_3$ | — | — |

TABLE 3-continued

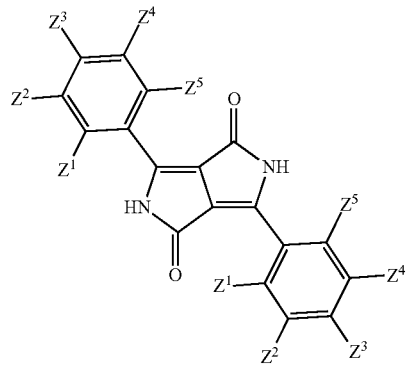

| | $Z^1$ | $Z^2$ | $Z^3$ | $Z^4$ | $Z^5$ |
|---|---|---|---|---|---|
| DPP-55 | — | —NO$_2$ | —OCH$_3$ | — | — |
| DPP 56 | — | —SO$_2$Me | OCH$_3$ | — | — |
| DPP-57 | — | —OCH$_3$ | —OCH$_3$ | — | — |
| DPP-58 | —CF$_3$ | — | —OCH$_3$ | — | — |
| DPP 59 | OCH$_3$ | — | OCH$_3$ | — | — |
| DPP-60 | —OCH$_3$ | — | —OCH$_3$ | — | —OCH$_3$ |
| DPP-61 | — | —OCH$_3$ | —OCH$_3$ | —OCH$_3$ | — |
| DPP 62 | F | F | OCH$_3$ | F | F |
| DPP-63 | — | — | —SCH$_3$ | — | — |
| DPP-64 | — | — | —SH | — | — |
| DPP-65 | — | — | —SC$_5$H$_{11}$ | — | — |
| DPP-66 | — | — | —SPh | — | — |
| DPP-67 | — | —Me | —SCH$_3$ | — | — |
| DPP-68 | — | — | —N(CH$_3$)$_2$ | — | — |
| DPP-69 | — | — | —NH$_2$ | — | — |
| DPP-70 | — | — | —NH(CH$_3$) | — | — |
| DPP-71 | — | — | —N(Ph)(CH$_3$) | — | — |
| DPP-72 | — | — | —N(Ph)$_2$ | — | — |
| DPP-73 | — | —Me | —N(CH$_3$)$_2$ | — | — |
| DPP-74 | — | —Cl | —N(CH$_3$)$_2$ | — | — |
| DPP-75 | — | —CN | —N(CH$_3$)$_2$ | — | — |
| DPP-76 | — | —COOMe | —N(CH$_3$)$_2$ | — | — |
| DPP-77 | — | —NO$_2$ | —N(CH$_3$)$_2$ | — | — |
| DPP-78 | — | —SO$_2$Me | —N(CH$_3$)$_2$ | — | — |
| DPP-79 | — | —OCH$_3$ | —N(CH$_3$)$_2$ | — | — |
| DPP-80 | —CF$_3$ | — | —N(CH$_3$)$_2$ | — | — |

The content of the pigment A is preferably 40% by mass or more, more preferably 45% by mass or more, and still more preferably 50% by mass or more with respect to the total solid content of the coloring composition. The upper limit can be set to 80% by mass or less.

The proportion of the pigment A in the total mass of the compound having a diketopyrrolopyrrole skeleton contained in the coloring composition is preferably 80% by mass or more, more preferably 90% by mass or more, and still more preferably 95% by mass or more, and it is particularly preferable that the compound having a diketopyrrolopyrrole skeleton is substantially only constituted with the pigment A. The case where the compound having a diketopyrrolopyrrole skeleton contained in the coloring composition is substantially only constituted with the pigment A means that the proportion of the pigment A in the total mass of the compound having a diketopyrrolopyrrole skeleton contained in the coloring composition is 99% by mass or more, preferably 99.5% by mass or more, and more preferably 99.9% by mass or more, and it is particularly preferable that the compound having a diketopyrrolopyrrole skeleton consists only of the pigment A.

In addition, the proportions of the pigment A in the total mass of the colorant contained in the coloring composition is preferably 60% by mass or more, more preferably 70% by mass or more, and still more preferably 80% by mass or more. The upper limit can be set to 90% by mass or less.

<<Other Colorants>>

The coloring composition of the embodiment of the present invention can contain a colorant (hereinafter, also referred to as other colorants) other than the pigment A. The other colorants may be either a pigment or a dye. The colorant may be used in combination of the pigment and the dye. The colorant used in the present invention preferably includes the pigment. Further, the content of the pigment in the colorant is preferably 50% by mass or more, more preferably 70% by mass or more, still more preferably 80% by mass or more, and particularly preferably 90% by mass or more. In addition, the colorant may be only constituted with the pigment.

Examples of the pigment include an inorganic pigment and an organic pigment, and the organic pigment is preferable. Specific examples of the organic pigment include pigments shown below.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments);

C. I. Pigment Orange 2, 5, 13, 16, 17:1, 31, 34, 36, 38, 43, 46, 48, 49, 51, 52, 55, 59, 60, 61, 62, 64, and the like (all orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, and the like (all red pigments);

C. I. Pigment Green 7, 10, 36, 37, 58, 59, and the like (all green pigments);

C. I. Pigment Violet 1, 19, 23, 27, 32, 37, 42, and the like (all violet pigments);

C. I. Pigment Blue 1, 2, 15, 15:1, 15:2, 15:3, 15:4, 15:6, 16, 22, 60, 64, 66, 79, 80, and the like (all blue pigments)

Furthermore, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A.

In addition, an aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

The dye is not particularly limited and known dyes can be used. As chemical structures thereof, a pyrazolazo-based dye, an anilinoazo-based dye, a triarylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyromethane-based dye, or the like can be used. Further, the thiazole compound described in JP2012-158649A, the azo compound described in JP2011-184493A, or the azo compound described in JP2011-145540A can also be preferably used. Furthermore, as yellow dyes, the quinophthalone compounds described in paragraph Nos. 0011 to 0034 of JP2013-054339A, the quinophthalone compounds described in paragraph Nos. 0013 to 0058 of JP2014-026228A, or the like can be used.

In addition, a coloring agent multimer can be used as the other colorants. The coloring agent multimer is preferably a dye that is used after being dissolved in a solvent, but the coloring agent multimer may form a particle. In a case where the coloring agent multimer is the particle, it is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures, and preferably three or more coloring agent structures in one molecule. The upper limit is particularly not limited, but can be 100 or less. A plurality of coloring agent structures contained in one molecule may be the same coloring agent structures or different coloring agent structures. The weight-average molecular weight (Mw) of the coloring agent multimer is preferably 2,000 to 50,000. The lower limit is more preferably 3,000 or more and still more preferably 6,000 or more. The upper limit is more preferably 30,000 or less and still more preferably 20,000 or less. In addition, as the coloring agent multimer, the compounds described in JP2011-213925A, JP2013-041097A, JP2015-028144A, JP2015-030742A, or the like can also be used.

As the other colorants, a yellow colorant is preferable, a yellow pigment is more preferable, one or more pigment selected from C. I. Pigment Yellow 139, C. I. Pigment Yellow 150, and C. I. Pigment Yellow 185 are still more preferable, one or more pigment selected from C. I. Pigment Yellow 139 and C. I. Pigment Yellow 185 are even still more preferable, and C. I. Pigment Yellow 139 is particularly preferable from the viewpoint of color reproducibility. In a case where a yellow pigment is used as the other colorants, an effect of further improving the dispersibility of the pigment A can also be obtained.

The content of the other colorants is preferably 40 parts by mass or less with respect to 100 parts by mass of the pigment A. The lower limit may be set to 1 part by mass, or 5 parts by mass. The upper limit is preferably 30 parts by mass or less and more preferably 20 parts by mass or less.

In addition, the content of the yellow colorant is preferably 40 parts by mass or less with respect to 100 parts by mass of the pigment A. The lower limit may be set to 1 part by mass, or 5 parts by mass. The upper limit is preferably 30 parts by mass or less and more preferably 20 parts by mass or less.

In addition, the total content of the pigment A and the other colorants is preferably 50% to 90% by mass with respect to the total solid content of the coloring composition. The lower limit is preferably 51% by mass or more and more preferably 55% by mass or more.

The upper limit is preferably 85% by mass or less and more preferably 80% by mass or less.

In addition, the total content of the pigment A and the yellow colorant is preferably 50% to 90% by mass with respect to the total solid content of the coloring composition. The lower limit is preferably 51% by mass or more and more preferably 55% by mass or more. The upper limit is preferably 85% by mass or less and more preferably 80% by mass or less.

<<Compound Having Curable Group>>

The coloring composition of the embodiment of the present invention contains a compound having a curable group. The reaction mechanism in the curing of the compound having a curable group is not particularly limited. Examples thereof include a radical polymerization reaction, a cationic polymerization reaction, a condensation polymerization reaction, a nucleophilic addition reaction, and a crosslinking reaction by a substitution reaction.

The compound having a curable group is preferably a compound which is cured by a radical polymerization reaction. Examples of the curable group include an ethylenically unsaturated group and an epoxy group. Examples of the ethylenically unsaturated group include a vinyl group, a vinyloxy group, an allyl group, a methallyl group, a (meth) acryloyl group, a styrene group, a cinnamoyl group, and a maleimide group, and a (meth)acryloyl group, a styrene group, and a maleimide group are preferable, a (meth) acryloyl group is more preferable, and an acryloyl group is particularly preferable.

The compound having a curable group (hereinafter, also referred to as a curable compound) may be a monomer, or a resin such as a polymer. It is also possible to use a monomer type curable compound and a resin type curable compound in combination.

(Compound Having Ethylenically Unsaturated Group)

In the present invention, a compound having an ethylenically unsaturated group (hereinafter, also referred to as a polymerizable compound) which is used as the curable compound may be a monomer (monomer having an ethylenically unsaturated group) or a resin (resin having an ethylenically unsaturated group). Hereinafter, the compound having an ethylenically unsaturated group is also referred to as a polymerizable compound. In addition, the monomer having an ethylenically unsaturated group is also referred to as a polymerizable monomer. In addition, the resin having an ethylenically unsaturated group is also referred to as a polymerizable resin.

The molecular weight of the polymerizable monomer is preferably less than 3000. The upper limit is more preferably 2,000 or less and still more preferably 1,500 or less. The lower limit is preferably 100 or more, more preferably 150 or more, and still more preferably 250 or more. The polymerizable monomer is preferably a compound including three or more ethylenically unsaturated groups, more preferably a compound including 3 to 15 ethylenically unsaturated groups, and still more preferably a compound having 3 to 6 ethylenically unsaturated groups. In addition, the polymerizable monomer is preferably a trifunctional to pentadecafunctional (meth)acrylate compound and more preferably a trifunctional to hexafunctional (meth)acrylate compound. Specific examples of the polymerizable monomer include compounds described in paragraph Nos. 0095 to 0108 of JP2009-288705A, paragraph No. 0227 of JP2013-029760A, and paragraph Nos. 0254 to 0257 of JP2008-292970A, and the contents of which are incorporated herein by reference.

The polymerizable monomer is preferably a compound such as dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., NK ESTER A-DPH-12E, manufactured by Shin-Nakamura Chemical Co., Ltd.); and a compound having a structure in which the (meth)acryloyl group is bonded through an ethylene glycol and/or a propylene glycol residue (for example, SR454 and SR499 which are commercially available products from Sartomer). As the polymerizable monomer, NK ESTER A-TMMT (manufactured by Shin-Nakamura Chemical Co., Ltd.) and KAYARAD RP-1040 and DPCA-20 (manufactured by Nippon Kayaku Co., Ltd.) can also be used. In addition, as the polymerizable monomer, it is preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

The polymerizable monomer may have an acid group. By using a polymerizable monomer having an acid group, a coloring composition layer in unexposed areas is easily removed in development and the generation of the development residue can be effectively suppressed. Examples of an acid group include a carboxyl group, a sulfo group, and a phosphoric acid group, and a carboxyl group is preferable. Examples of a commercially available product of the polymerizable monomer having an acid group include ARONIX M-510, M-520, ARONIX TO-2349 (manufactured by TOAGOSEI CO., LTD.).

An acid value of the polymerizable monomer having an acid group is preferably 0.1 to 40 mgKOH/g and more preferably 5 to 30 mgKOH/g. In a case where an acid value of the polymerizable monomer is 0.1 mgKOH/g or more, solubility in a developer is good, and more excellent developability is obtained. In a case where an acid value of the polymerizable monomer is 40 mgKOH/g or less, it is advantageous in production and handling.

The polymerizable monomer is preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

A compound having an alkyleneoxy group can also be used as the polymerizable monomer. The polymerizable monomer having an alkyleneoxy group is preferably a compound having an ethyleneoxy group and/or a propyleneoxy group, more preferably a compound having an ethyleneoxy group, and still more preferably a trifunctional to hexafunctional (meth)acrylate compound having 4 to 20 ethyleneoxy groups. Examples of a commercially available product of the polymerizable monomer having an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd, which is a trifunctional (meth) acrylate having three isobutyleneoxy groups.

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable monomer. In addition, polymerizable compounds having an amino structure or a sulfide structure in the molecule described in JP1988-277653A (JP-S63-277653A), JP1988-260909A (JP-S63-260909A), or JP1989-105238A (JP-H01-105238A) are preferably used. Examples of a commercially available product include UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

In addition, as the polymerizable monomer, 8UH-1006 or 8UH-1012 (manufactured by Taisei Fine Chemical Co., Ltd.), Light Acrylate POB-A0 (manufactured by Kyoeisha Chemical Co., Ltd.), or the like is also preferably used.

Furthermore, as the polymerizable monomer, the compounds described in JP2017-048367A, JP6057891B, or JP6031807B can also be used.

The weight-average molecular weight of the polymerizable resin is preferably 3000 or more, more preferably 5000 or more, still more preferably 7000 or more, and particularly preferably 10000 or more. In addition, the weight-average molecular weight of the polymerizable resin is preferably 50000 or less, more preferably 40000 or less, and still more preferably 30000 or less.

The amount of the ethylenically unsaturated group (hereinafter, also referred to as a C=C value) of the polymerizable resin is preferably 0.2 to 5.0 mmol/g. The upper limit is more preferably 4.0 mmol/g or less and still more preferably 3.0 mmol/g or less. The lower limit is more preferably 0.3 mmol/g or more. The C=C value of the polymerizable resin is a numerical value representing a molar amount of a C=C group per 1 g of the solid content of the polymerizable resin. With regard to the C=C value of the polymerizable resin, a low-molecular-weight component (a) of a C=C group site is extracted from the polymerizable resin by an alkali treatment, a content of the low-molecular-weight component is measured by high-performance liquid chromatography (HPLC), and the C=C value of the polymerizable resin can be calculated by the following formula. In a case where the C=C group site cannot be extracted from the polymerizable resin by the alkali treatment, a value measured by a nuclear magnetic resonance (NMR) method is used.

C=C Value [mmol/g] of Polymerizable Resin=(Content [ppm] of Low-Molecular-Weight Component (a)/Molecular Weight [g/mol] of Low-Molecular-Weight Component (a)/(Weighed Value [g] of Polymerizable Resin)×(Concentration of Solid Contents [% by mass] of Polymerizable Resin/100)×10)

The polymerizable resin preferably includes a repeating unit having an ethylenically unsaturated group in the side chain, more preferably include a repeating unit represented by Formula (A-1-1). In the polymerizable resin, the repeating unit having an ethylenically unsaturated group is preferably contained in an amount of 10% by mole or more, more preferably 10% to 80% by mole, and still more preferably 20% to 70% by mole in all the repeating units of the polymerizable resin.

In Formula (A-1-1), $X^1$ represents the main chain of the repeating unit, $L^1$ represents a single bond or a divalent linking group, and $Y^1$ represents an ethylenically unsaturated group.

In Formula (A-1-1), the main chain of the repeating unit represented by X1 is not particularly limited as long as it is a linking group formed from a known polymerizable monomer. Examples thereof include a poly (meth)acrylic linking group, a polyalkyleneimine-based linking group, a polyester-based linking group, a polyurethane-based linking group, a polyuria-based linking group, a polyamide-based linking group, a polyether-based linking group, and a polystyrene-based linking group. A poly (meth)acrylic linking group and a polyalkyleneimine-based linking group are preferable, and a poly (meth)acrylic linking group is more preferable from the viewpoint of availability of raw materials and production suitability.

In Formula (A-1-1), examples of the divalent linking group represented by $L^1$ include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups.

In Formula (A-1-1), examples of the ethylenically unsaturated group represented by $Y^1$ include a vinyl group, a vinyloxy group, an allyl group, a methallyl group, a (meth)acryloyl group, a styrene group, a cinnamoyl group, and a maleimide group, and a (meth)acryloyl group, a styrene group, and a maleimide group are preferable, a (meth)acryloyl group is more preferable, and an acryloyl group is particularly preferable.

The polymerizable resin preferably further includes a repeating unit having a graft chain. In a case where the polymerizable resin includes a repeating unit having a graft chain, aggregation of the pigment A and the like can be more effectively suppressed due to steric hindrance by the graft chain. In the polymerizable resin, the repeating unit having a graft chain is preferably contained in an amount of 1.0% to 60% by mole, and more preferably 1.5% to 50% by mole in all the repeating units of the polymerizable resin. The polymerizable resin including the repeating unit having a graft chain is preferably used as a dispersant.

In the present invention, the graft chain means a polymer chain branched from the main chain of the repeating unit. The length of the graft chain is not particularly limited, and in a case where the graft chain gets longer, a steric repulsion effect is enhanced, and thus, the dispersibility of the pigment A or the like can be increased. As the graft chain, the number of atoms excluding the hydrogen atoms is preferably 40 to 10,000, the number of atoms excluding the hydrogen atoms is more preferably 50 to 2,000, and the number of atoms excluding the hydrogen atoms is still more preferably 60 to 500.

The graft chain contained in the polymerizable resin preferably includes at least one structure selected from a polyester structure, a polyether structure, a poly (meth)acryl structure, a polyurethane structure, a polyurea structure, or a polyamide structure, more preferably includes at least one structure selected from a polyester structure, a polyether structure, or a poly (meth)acryl structure, and still more preferably includes a polyester structure. Examples of the polyester structure include a structure represented by Formula (G-1), Formula (G-4), or Formula (G-5). Examples of the polyether structure include a structure represented by Formula (G-2). Examples of the poly (meth)acryl structure include a structure represented by Formula (G-3).

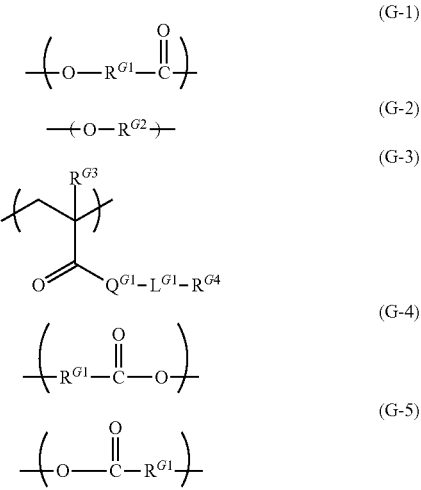

In the formulae, $R^{G1}$ and $R^{G2}$ each independently represent an alkylene group. The alkylene group represented by $R^{G1}$ and $R^{G2}$ is not particularly limited, but is preferably a linear or branched alkylene group having 1 to 20 carbon atoms, more preferably a linear or branched alkylene group having 2 to 16 carbon atoms, and still more preferably a linear or branched alkylene group having 3 to 12 carbon atoms.

In the formulae, $R^{G3}$ represents a hydrogen atom or a methyl group.

In the formulae, $Q^{G1}$ represents —O— or —NH—, and $L^{G1}$ represents a single bond or a divalent linking group. Examples of the divalent linking group include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups.

$R^{G4}$ represents a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group.

For example, in a case where the graft chain includes a polyester structure, only one kind of polyester structure may be included, or two or more kinds of polyester structures having different $R^{G1}$'s may be included. In a case where the graft chain includes a polyether structure, only one kind of polyether structure may be included, or two or more kinds of polyether structures having different $R^{G2}$'s may be included. In a case where the graft chain includes a poly (meth)acryl structure, only one kind of poly (meth)acryl structure may be included, or two or more kinds of poly (meth)acryl structures different in at least one selected from $R^{G3}$, $Q^{G1}$, $L^{G1}$, and $R^{G4}$ may be included.

A terminal structure of the graft chain is not particularly limited. The terminal structure of the graft chain may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among those, from the viewpoint of improvement of the dispersibility of the coloring material or the like, a group having a steric repulsion effect is preferable, and an alkyl group or alkoxy group having 5 to 24 carbon atoms is preferable.

The alkyl group and the alkoxy group may be any of linear, branched, and cyclic forms, and are preferably linear or branched.

In the present invention, the graft chain is preferably a structure represented by Formula (G-1a), Formula (G-2a), Formula (G-3a), Formula (G-4a), or Formula (G-5a).

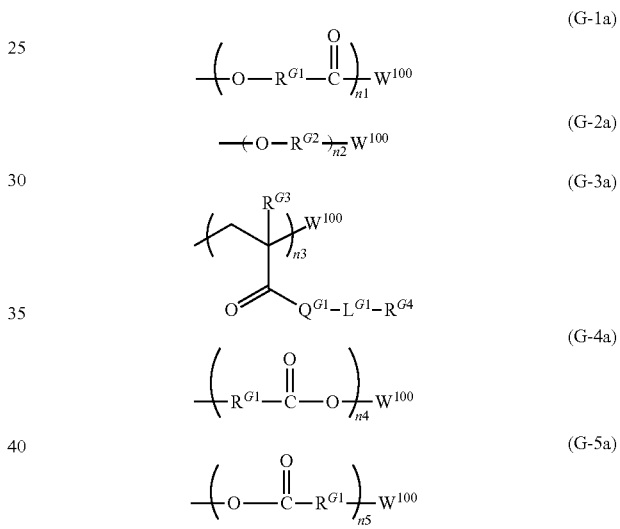

In the formulae, $R^{G1}$ and $R^{G2}$ each independently represent an alkylene group, $R^{G3}$ represents a hydrogen atom or a methyl group, $Q^{G1}$ represents —O— or —NH—, $L^{G1}$ represents a single bond or a divalent linking group, $R^{G4}$ represents a hydrogen atom or a substituent, and $W^{100}$ represents a hydrogen atom or a substituent. n1 to n5 each independently represent an integer of 2 or more. $R^{G1}$ to $R^{G4}$, $Q^{G1}$, and $L^{G1}$ have the same meanings as $R^{G1}$ to $R^{G4}$, $Q^{G1}$, and $L^{G1}$ described in Formulae (G-1) to (G-5), and preferred ranges thereof are also the same.

In Formulae (G-1a) to (G-5a), it is preferable that $W^{100}$ represents a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among those, from the viewpoint of improvement of the dispersibility of the coloring material or the like, a group having a steric repulsion effect is preferable, and an alkyl group or alkoxy group having 5 to 24 carbon atoms is preferable. The alkyl group and the alkoxy group may be any of linear, branched, and cyclic forms, and are preferably linear or branched.

In Formulae (G-1a) to (G-5a), n1 to n5 each independently represent an integer of 2 or more, and is preferably 3 or more and more preferably 5 or more. The upper limit is, for example, preferably 100 or less, more preferably 80 or less, and still more preferably 60 or less.

In Formula (G-1a), $R^{G1}$'s in each repeating unit may be the same or different. In a case where $R^{G1}$ includes two or more kinds of repeating units different from each other, the arrangement of the repeating units is not particularly limited, and may be performed in any of a random manner, an alternative manner, and a blocked manner. The same applies to Formulae (G-2a) to (G-5a).

Examples of the repeating unit having a graft chain include a repeating unit represented by Formula (A-1-2).

(A-1-2)

Examples of the main chain of the repeating unit represented by $X^2$ in Formula (A-1-2) include the structures described in the description of $X^1$ of Formula (A-1-1), and preferred ranges thereof are also the same. Examples of the divalent linking group represented by $L^2$ in Formula (A-1-2) include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups. Examples of the graft chain represented by $W^1$ in Formula (A-1-2) include the graft chains described above.

In a case where the polymerizable resin includes a repeating unit having a graft chain, the weight-average molecular weight (Mw) of the repeating unit having a graft chain is preferably 1000 or more, more preferably 1000 to 10000, and still more preferably 1000 to 7500. In the present invention, the weight-average molecular weight of the repeating unit having a graft chain is a value calculated from the weight-average molecular weight of the raw material monomer used for the polymerization of the repeating unit. For example, the repeating unit having a graft chain can be formed by polymerizing a macromonomer. Here, the macromonomer means a polymer compound in which a polymerizable group is introduced into a polymer terminal. In a case where the repeating unit having a graft chain is formed using a macromonomer, the weight-average molecular weight of the macromonomer corresponds to the repeating unit having a graft chain.

The polymerizable resin preferably further includes a repeating unit having an acid group. In a case where the polymerizable resin further includes a repeating unit having an acid group, the dispersibility of the pigment A or the like can be further improved.

Furthermore, developability can also be improved. Examples of the acid group include a carboxyl group, a sulfo group, and a phosphoric acid group.

The repeating unit having an acid group include a repeating unit represented by Formula (A-1-3).

(A-1-3)

Examples of the main chain of the repeating unit represented by $X^3$ in Formula (A-1-3) include the structures described in the description of $X^1$ in Formula (A-1-1), and preferred ranges thereof are also the same.

Examples of the divalent linking group represented by $L^3$ in Formula (A-1-3) include an alkylene group (preferably an alkylene group having 1 to 12 carbon atoms), an alkenylene group (preferably an alkenylene group having 2 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups. The alkylene group, the alkylene group in the alkyleneoxy group, and the alkylene group in the oxyalkylenecarbonyl group may be any of linear, branched, and cyclic forms, and are preferably linear or branched. The alkylene group, the alkylene group in the alkyleneoxy group, and the alkylene group in the oxyalkylenecarbonyl group may have a substituent or may be unsubstituted. Examples of the substituent include a hydroxyl group.

Examples of the acid group represented by $A^1$ in Formula (A-1-3) include a carboxyl group, a sulfo group, and a phosphoric acid group.

An acid value of the polymerizable resin is preferably 20 to 150 mgKOH/g. The upper limit is more preferably 100 mgKOH/g or less. The lower limit is preferably 30 mgKOH/g or more and more preferably 35 mgKOH/g or more. In a case where the acid value of the polymerizable resin is within the above range, particularly excellent dispersibility is easily obtained. Furthermore, excellent developability is also easily obtained.

As other repeating units, the polymerizable resin may further include a repeating unit derived from a monomer component including a compound represented by Formula (ED1) and/or a compound represented by Formula (ED2) (hereinafter, these compounds may be referred to as an "ether dimer").

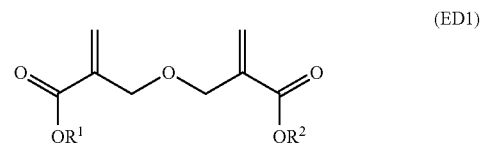

(ED1)

In Formula (ED1), $R^1$ and $R^2$ each independently represent a hydrogen atom or a hydrocarbon group having 1 to 25 carbon atoms, which may have a substituent.

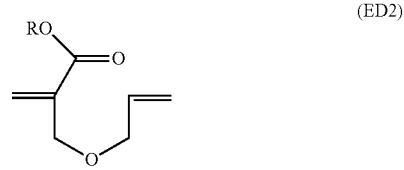

(ED2)

In Formula (ED2), R represents a hydrogen atom or an organic group having 1 to 30 carbon atoms. With regard to the specific examples of Formula (ED2), reference can be made to JP2010-168539A.

With regard to the specific examples of the ether dimer, reference can be made to paragraph No. 0317 of JP2013-029760A, and the contents thereof are incorporated herein by reference. The ether dimers may be used singly or in combination of two or more kinds thereof.

Specific examples of the polymerizable resin include the following resins.

of the epoxy compound is preferably 500 g/eq or less, more preferably 100 to 400 g/eq, and still more preferably 100 to 300 g/eq.

The epoxy compound may be either a low-molecular-weight compound (for example, a molecular weight of less than 1,000) or a high-molecular-weight compound (macromolecule) (for example, a molecular weight of 1,000 or

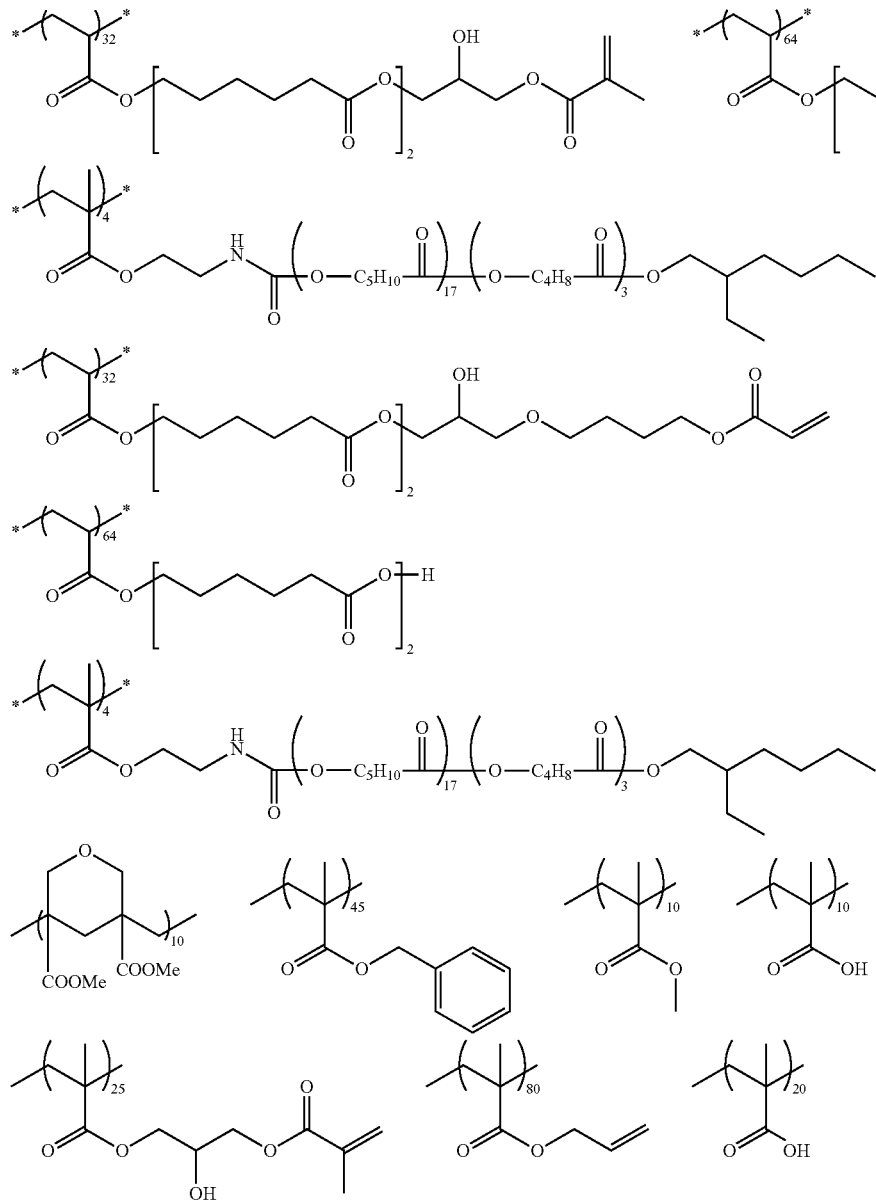

(Compound Having Epoxy Group)

In the present invention, a compound having an epoxy group (hereinafter, also referred to as an epoxy compound) which is used as the curable compound is preferably a compound having two or more epoxy groups in one molecule. The upper limit of the epoxy group of the epoxy compound is preferably 100 or less, more preferably 10 or less, and still more preferably 5 or less.

The epoxy equivalent (=the molecular weight of a compound having an epoxy group/the number of epoxy groups)

more, and in a case of a polymer, a weight-average molecular weight of 1,000 or more). The molecular weight (in a case of the polymer, the weight-average molecular weight) of the epoxy compound is preferably 200 to 100,000 and more preferably 500 to 50,000. The upper limit of the molecular weight (in a case of the polymer, the weight-average molecular weight) is preferably 3,000 or less, more preferably 2,000 or less, and still more preferably 1,500 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference. With regard to a commercially available product of the epoxy compound, examples of a bisphenol A type epoxy resin include jER825, jER827, jER828, jER834, jER1001, jER1002, jER1003, jER1055, jER1007, jER1009, and jER1010 (all manufactured by Mitsubishi Chemical Corporation), and EPICLON 860, EPICLON 1050, EPICLON 1051, and EPICLON 1055 (all manufactured by DIC Corporation). Examples of a bisphenol F type epoxy resin include jER806, jER807, jER4004, jER4005, jER4007, and jER4010 (all manufactured by Mitsubishi Chemical Corporation), EPICLON 830 and EPICLON 835 (both manufactured by DIC Corporation), and LCE-21 and RE-602S (both manufactured by Nippon Kayaku Co., Ltd.). Examples of a phenol novolac type epoxy resin include jER152, jER154, jER157S70, and jER157S65 (all manufactured by Mitsubishi Chemical Corporation), and EPICLON N-740, EPICLON N-770, and EPICLON N-775 (all manufactured by DIC Corporation). Examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (manufactured by Nippon Kayaku Co., Ltd.). Examples of an aliphatic epoxy resin include ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Corporation), and DENACOL EX-212L, DENACOL EX-214L, DENACOL EX-216L, DENACOL EX-321L, and DENACOL EX-850L (all manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Mitsubishi Chemical Corporation).

The content of the curable compound is preferably 5% to 50% by mass with respect to the total solid content of the coloring composition. The lower limit is preferably 8% by mass or more and more preferably 10% by mass or more. The upper limit is preferably 45% by mass or less and more preferably 40% by mass or less.

In a case where the polymerizable compound is used as the curable compound, the content of the polymerizable compound is preferably 5% to 50% by mass with respect to the total solid content of the coloring composition. The lower limit is preferably 8% by mass or more and more preferably 10% by mass or more. The upper limit is preferably 45% by mass or less and more preferably 40% by mass or less.

In a case where the polymerizable monomer is used as the curable compound, the content of the polymerizable monomer is preferably 0.1% to 40% by mass with respect to the total solid content of the coloring composition. The lower limit is preferably 1% by mass or more and more preferably 2% by mass or more. The upper limit is preferably 30% by mass or less and more preferably 20% by mass or less.

In a case where the polymerizable resin is used as the curable compound, the content of the polymerizable resin is preferably 5% to 50% by mass with respect to the total solid content of the coloring composition. The lower limit is preferably 8% by mass or more and more preferably 10% by mass or more. The upper limit is preferably 45% by mass or less and more preferably 40% by mass or less. The content of the polymerizable resin in the total amount of the polymerizable monomer and the polymerizable resin is preferably 70% by mass or more and more preferably 80% by mass or more.

In a case where the epoxy compound is used as the curable compound, the content of the epoxy compound is preferably 0.1% to 40% by mass with respect to the total solid content of the coloring composition. The lower limit is, for example, more preferably 1% by mass or more, and still more preferably 2% by mass or more. The upper limit is, for example, more preferably 30% by mass or less, and still more preferably 20% by mass or less. These epoxy compounds may be used singly or in combination of two or more kinds thereof. In a case where the polymerizable compound and the compound having an epoxy group are used in combination, the proportion (mass ratio) between the compounds is preferably the mass of the polymerizable compound: the mass of the compound having an epoxy group=100:1 to 100:400, more preferably 100:1 to 100:100, and still more preferably 100:1 to 100:50.

A preferred aspect of the coloring composition of the embodiment of the present invention is as follows.

A coloring composition including: a monomer having an ethylenically unsaturated group; and a resin, in which a ratio M1/B1 of a mass M1 of the monomer having an ethylenically unsaturated group contained in the coloring composition to a mass B1 of the resin contained in the coloring composition is 0.3 or less, preferably 0.2 or less. According to the coloring composition of this aspect, the coloring composition can be preferably used as a coloring composition for photolithography. The mass B1 of the resin is the total amount of the polymerizable resin and other resins to be described later. In a case where the coloring composition does not include other resins, the mass B1 of the resin is the mass of the polymerizable resin. In a case where the coloring composition does not include the polymerizable resin, the resin mass B1 is the mass of other resins.

Another preferred aspect of the coloring composition of the embodiment of the present invention is as follows.

A coloring composition including: an epoxy compound as a curable compound. According to the coloring composition of this aspect, the coloring composition can be preferably used as a coloring composition for dry etching.

<<Other Resins>>

The coloring composition of the embodiment of the present invention may further contain a resin including no curable group (hereinafter, also referred to as other resins). The other resins are blended in, for example, an application for dispersing particles such as a pigment in the composition or an application as a binder. Incidentally, a resin which is used for dispersing particles such as a pigment in the composition is also referred to as a dispersant. However, such applications of the resin are only exemplary, and the resin can also be used for other purposes, in addition to such uses.

The weight-average molecular weight (Mw) of the other resins is preferably 2000 to 2000000. The upper limit is preferably 1000000 or less and more preferably 500000 or less. The lower limit is preferably 3000 or more and more preferably 5000 or more.

Examples of the other resins include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof.

The other resins may have an acid group. Examples of the acid group include a carboxyl group, a phosphoric acid group, a sulfo group, and a phenolic hydroxyl group, and the carboxyl group is preferable. These acid groups may be used singly or in combination of two or more kinds thereof. The resin having an acid group can also be used as an alkali-soluble resin.

The resin having an acid group is preferably a polymer having a carboxyl group in the side chain. Specific examples thereof include methacrylic acid copolymers, acrylic acid copolymers, itaconic acid copolymers, crotonic acid copolymers, maleic acid copolymers, partially esterified maleic acid copolymers, alkali-soluble phenol resins such as novolak resin, acidic cellulose derivatives having a carboxyl group in the side chain, and resins in which an acid anhydride is added to a polymer having a hydroxyl group. In particular, a copolymer of a (meth)acrylic acid and another monomer copolymerizable therewith is suitable as the alkali-soluble resin. Examples of another monomer copolymerizable with the (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and glycidyl (meth)acrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of one kind or of two or more kinds thereof.

As the resin having an acid group, a benzyl (meth)acrylate/(meth)acrylic acid copolymer, a benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, a compound obtained by copolymerizing 2-hydroxyethyl (meth)acrylate, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used.

The resin having an acid group is also preferably a polymer including a repeating unit derived from a monomer component having the ether dimer.

The resin having an acid group may include a repeating unit derived from a compound represented by Formula (X).

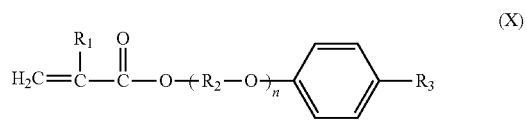

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may include a benzene ring. n represents an integer of 1 to 15.

With regard to the resin having an acid group, reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, and the contents thereof are incorporated herein by reference. A commercially available product can also be used as the resin having an acid group.

The acid value of the resin having an acid group is preferably 30 to 200 mgKOH/g. The lower limit is preferably 50 mgKOH/g or more and more preferably 70 mgKOH/g or more. The upper limit is preferably 150 mgKOH/g or less and more preferably 120 mgKOH/g or less.

Examples of the resin having an acid group include a resin having the following structure.

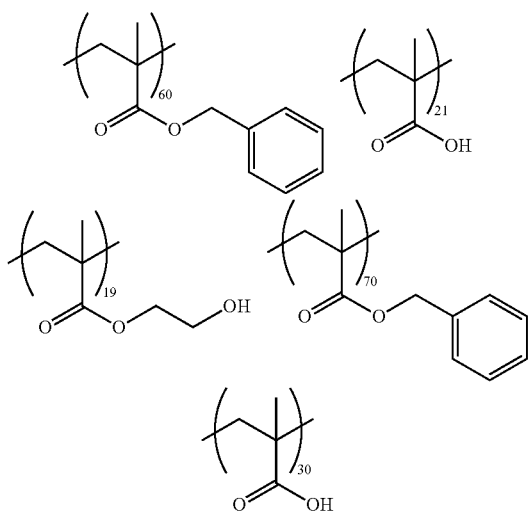

The coloring composition of the embodiment of the present invention can include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70% by mole or more in a case where the total amount of the acid group and the basic group is 100% by mole, and more preferably a resin consisting substantially of only an acid group. The acid group contained in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50% by mole in a case where the total amount of the acid group and the basic group is 100% by mole. The basic group contained in the basic dispersant is preferably an amino group.

The resin used as a dispersant preferably includes a repeating unit having an acid group. In a case where the resin used as a dispersant includes the repeating unit having an acid group, the residue generated in a base of pixels can be further reduced in the formation of a pattern by a photolithography method.

As the resin used as a dispersant, a graft resin (hereinafter, also referred to as a graft resin A) including a repeating unit A having a poly (meth)acrylate structure as the main chain and having a graft chain of a polyester structure in the side chain is preferably used. According to this aspect, the dispersibility of the pigment A can be increased, and a coloring composition having excellent coatability can be obtained.

The number of repetitions of the polyester in the graft chain is preferably 3 or more, more preferably 4 or more, and still more preferably 5 or more from the viewpoint of dispersibility of the pigment.

A terminal structure of the graft chain is not particularly limited. The terminal structure of the graft chain may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among those, from the viewpoint of improvement of the dispersibility of the pigment (DPP), a group having a steric repulsion effect is preferable, and an alkyl group or alkoxy group having 5 to 24 carbon atoms is preferable. The alkyl group and the alkoxy group may be any of linear, branched, and cyclic forms, and are preferably linear or branched.

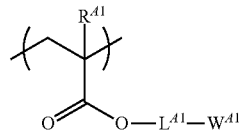

Formula (GA)

In the formula, $R^{A1}$ represents a hydrogen atom or an alkyl group, $L^{A1}$ represents a single bond or a divalent linking group, and $W^{A1}$ represents a graft chain having a polyester structure.

The alkyl group represented by $R^{A1}$ preferably has 1 to 5 carbon atoms, more preferably has 1 to 3 carbon atoms, and more preferably has 1 carbon atom. $R^{A1}$ is preferably a hydrogen atom or a methyl group.

Examples of the divalent linking group represented by $L^{A1}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups. The alkylene group may be any of linear, branched, and cyclic forms, and is preferably linear or branched.

$W^{A1}$ represents a graft chain having a polyester structure. The graft chain having a polyester structure is preferably the graft chain having a structure represented by Formula (G-1a), Formula (G-4a), or Formula (G-5a) described above.

The graft resin A preferably includes 20% by mole or more of the repeating unit A in all the repeating units of the graft resin A. The upper limit may be 100% by mole, 90% by mole or less, 80% by mole or less, 70% by mole or less, or 60% by mole or less.

With regard to details of the graft resin A, reference can be made to the description in paragraph Nos. 0025 to 0094 of JP2012-255128A, and the contents thereof are incorporated herein by reference. In addition, examples of the graft resin A include the following resins.

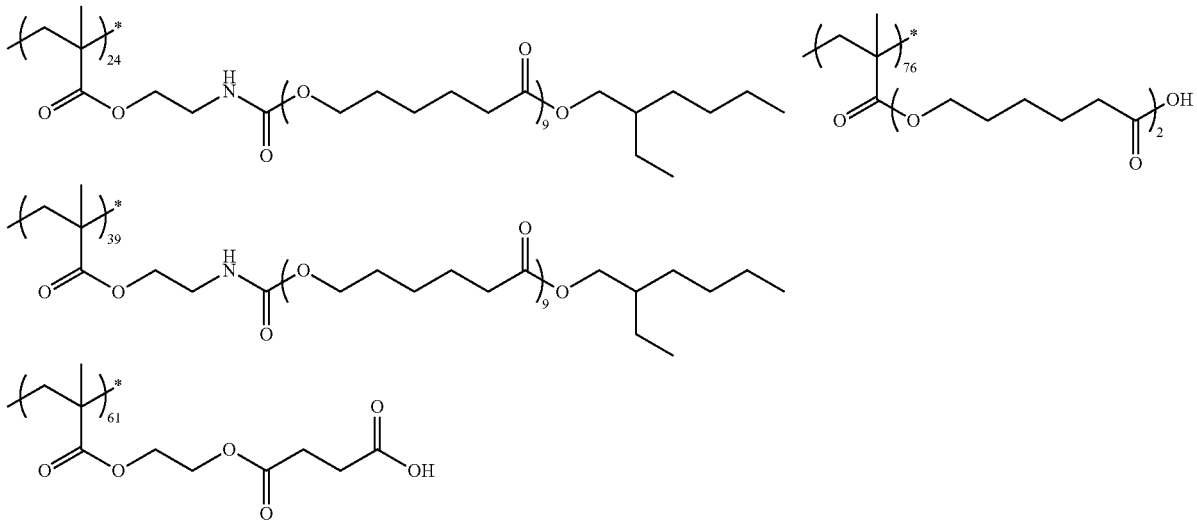

The repeating unit A in the graft resin A is preferably a repeating unit represented by Formula (GA).

In the present invention, as the resin used as a dispersant, an oligoimine-based dispersant including a nitrogen atom in at least one of the main chain or the side chain can also be used. As the oligoimine-based dispersant, a resin having a structural unit having a partial structure X having a functional group of pKa14 or less, and a side chain including a side chain Y having 40 to 10,000 atoms, in which at least one of the main chain or the side chain has a basic nitrogen atom is preferable. The basic nitrogen atom is not particularly limited as long as it is a nitrogen atom exhibiting basicity. With regard to the oligoimine-based dispersant, reference can be made to the description in paragraph Nos. 0102 to 0166 of JP2012-255128A, and the contents thereof are incorporated herein by reference. The resins described in paragraph Nos. 0168 to 0174 of JP2012-255128A can be used as the oligoimine-based dispersant.

A commercially available product is also available as the dispersant, and specific examples thereof include Disperbyk series (for example, Disperbyk-111) manufactured by BYK Chemie, and Solsperse series (for example, Solsperse 76500) manufactured by Lubrizol Corporation. The dispersing agent described in paragraphs 0041 to 0130 of JP2014-130338A can also be used, and the contents thereof are incorporated herein by reference. The resin having an acid group and the like can also be used as the dispersant.

In a case where the coloring composition of the embodiment of the present invention includes other resins, the content of the other resins is preferably 30% by mass or less, more preferably 20% by mass or less, and still more preferably 10% by mass with respect to the total solid content of the coloring composition of the embodiment of the present invention.

In addition, the coloring composition of the embodiment of the present invention may substantially include no other resins. The case where the coloring composition of the embodiment of the present invention substantially includes no other resins means that the content of the other resins in the total solid content of the coloring composition of the embodiment of the present invention is preferably 0.1% by mass or less, more preferably 0.05% by mass or less, and particularly preferably 0% by mass.

The total content of the curable compound and the other resins is preferably 10% to 50% by mass with respect to the total solid content of the coloring composition of the embodiment of the present invention. The lower limit is preferably 12% by mass or more and more preferably 14% by mass or more. The upper limit is preferably 45% by mass or less and more preferably 40% by mass or less.

<<Photopolymerization Initiator>>

In a case where the compound having a curable group used for the coloring composition of the embodiment of the present invention includes a compound having an ethylenically unsaturated group, the coloring composition of the embodiment of the present invention preferably further includes a photopolymerization initiator. The photopolymerization initiator is not particularly limited, and it is possible to appropriately select from known photopolymerization initiators. For example, a compound having photosensitivity to light in a range from the ultraviolet range to the visible range is preferable. In addition, the photopolymerization initiator may be a compound that produces an active radical by causing some action with a photoexcited sensitizer.

Examples of the photopolymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an α-aminoketone compound. From the viewpoint of the exposure sensitivity, as the photopolymerization initiator, a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound are preferable, a compound selected from the oxime compound, the α-hydroxyketone compound, the α-aminoketone compound, and the acylphosphine compound is more preferable, and the oxime compound is still more preferable. With regard to the photopolymerization initiator, reference can be made to the description in paragraph Nos. 0065 to 0111 of JP2014-130173A and paragraph Nos. 0274 to 0306 of JP2013-029760A, and the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

Examples of the oxime compound include the compounds described in JP2001-233842A, the compounds described in JP2000-080068A, the compounds described in JP2006-342166A, the compounds described in J. C. S. Perkin 11 (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, and the compounds described in WO2017/051680A. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. As a commercially available product of the oxime compound, IRGACURE-OXE01, IRGACURE-OXE02, IRGACURE-OXE03, and IRGACURE-OXE04 (all manufactured by BASF) are also suitably used. In addition, examples of the commercially available product include TRONLY TR-PBG-304, TRONLY TR-PBG-309, and TRONLY TR-PBG-305 (manufactured by CHANGZHOU TRONLY NEW ELECTRONIC MATERIALS CO., LTD.), ADEKA ARKLS NCI-930 and ADEKA OPTOMER N-1919 (both manufactured by Adeka Corporation, a photopolymerization initiator 2 described in JP2012-014052A).

Moreover, as oxime compounds other than the above-described oxime compounds, the compounds described in JP2009-519904A in which oxime is linked to N of a carbazole ring, the compounds described in U.S. Pat. No. 7,626,957B in which a hetero-substituent is introduced into a benzophenone moiety, the compounds described in JP2010-015025A in which a nitro group is introduced into a coloring agent site, the compounds described in US2009-0292039A, the ketoxime compounds described in WO2009/131189A, the compounds described in U.S. Pat. No. 7,556,910B, which contains a triazine skeleton and an oxime skeleton in the same molecule, the compound described in JP2009-221114A, which has an absorption maximum at 405 nm and has good sensitivity to a light source of g-rays, and the like may be used.

In the present invention, an oxime compound having a fluorene ring can also be used as the photopolymerization initiator. Specific examples of the oxime compound having a fluorene ring include the compounds described in JP2014-137466A. The contents of the publications are incorporated herein by reference.

In the present invention, an oxime compound having a benzofuran skeleton can also be used as the photopolymerization initiator. Specific examples thereof include the compounds OE-01 to OE-75 described in WO2015/036910A.

In the present invention, an oxime compound having a skeleton in which at least one benzene ring of a carbazole ring is a naphthalene ring can also be used as the photopolymerization initiator. Specific examples of such an oxime compound include the compounds described in WO2013/083505A.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A. The contents of the publications are incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

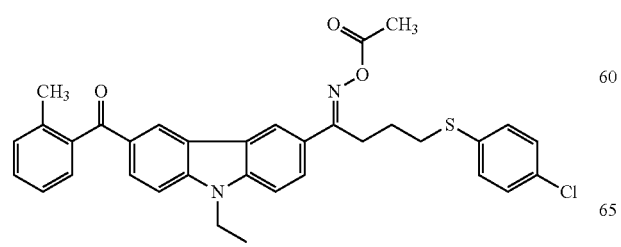

(C-1)

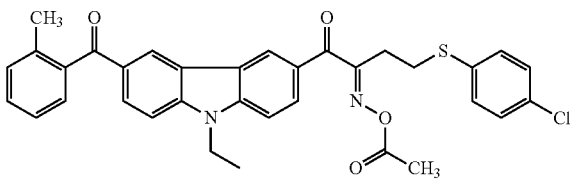

(C-2)

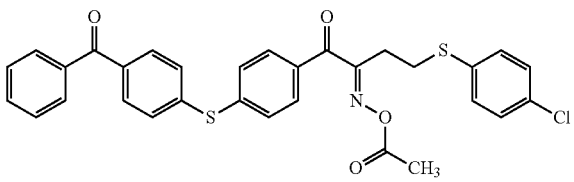

(C-3)

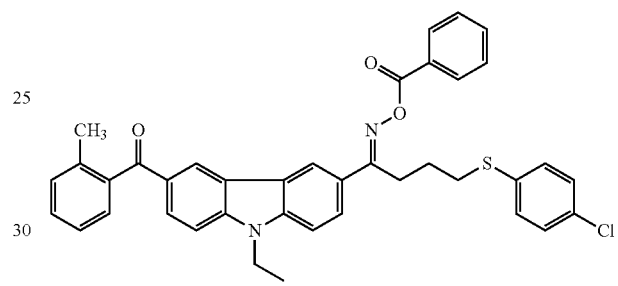

(C-4)

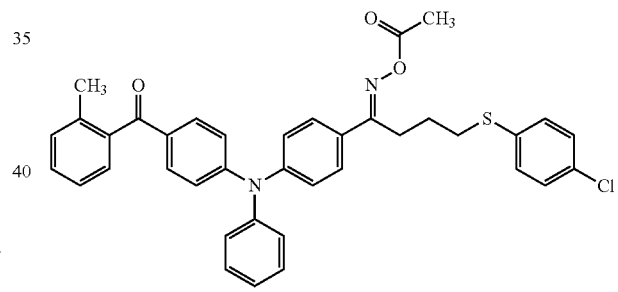

(C-5)

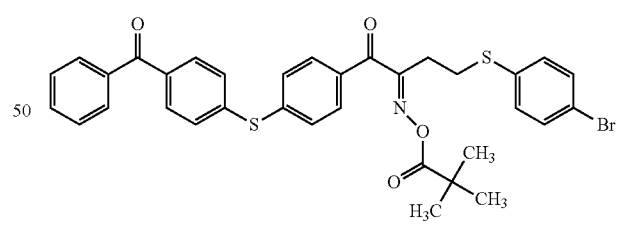

(C-6)

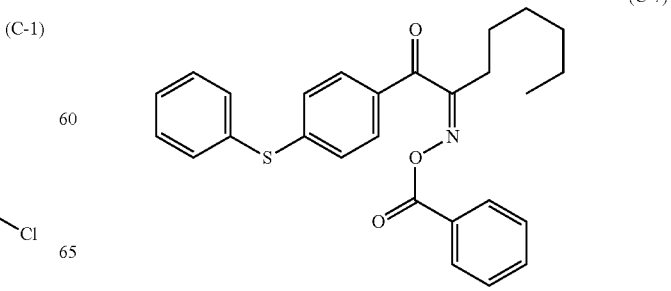

(C-7)

(C-8) 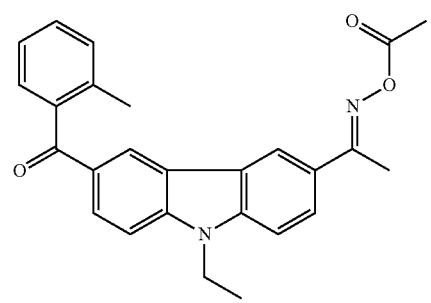

(C-9) 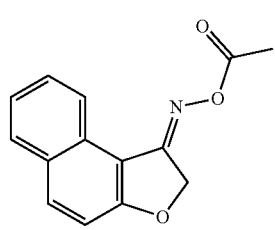

(C-10) 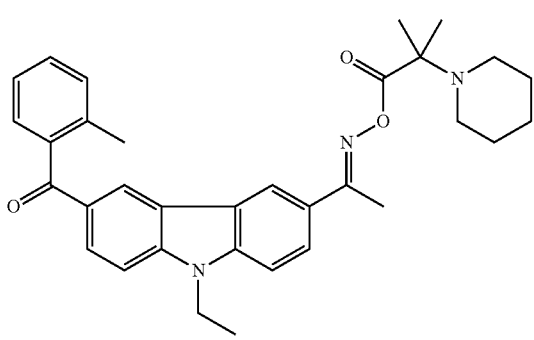

(C-11) 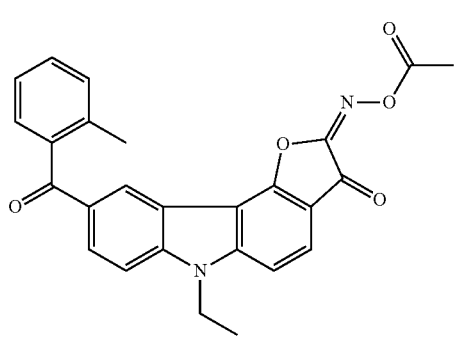

(C-12) 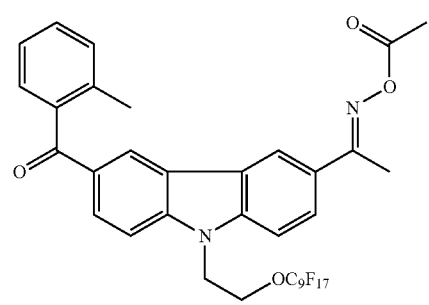

(C-13) 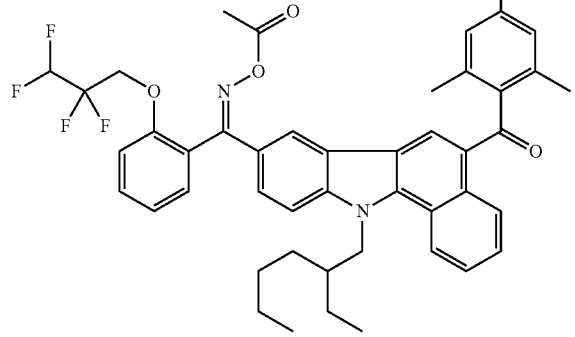

(C-14) 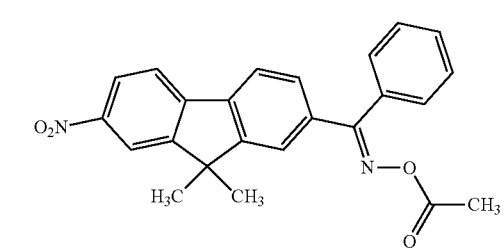

(C-15) 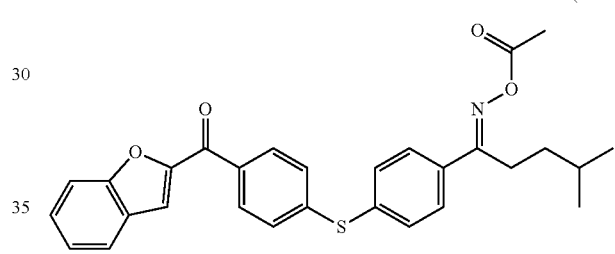

(C-16) 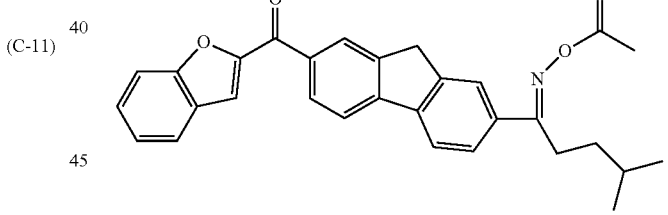

As the oxime compound, a compound having a maximum absorption wavelength in a range of 350 to 500 nm is preferable, and a compound having a maximum absorption wavelength in a range of 360 nm to 480 nm is more preferable. The oxime compound is preferably a compound having a high absorbance at 365 nm and 405 nm.

From the viewpoint of sensitivity, the molar absorption coefficient at 365 nm or 405 nm of the oxime compound is preferably 1,000 to 300,000, more preferably 2,000 to 300,000, and particularly preferably 5,000 to 200,000. The molar absorption coefficient of a compound can be measured using a known method. For example, the molar absorption coefficient is preferably measured by means of an ultraviolet and visible light spectrophotometer (Cary-5 spectrophotometer, manufactured by Varian) at a concentration of 0.01 g/L using ethyl acetate solvent.

In the present invention, a difunctional, or trifunctional or higher photopolymerization initiator may be used as the photopolymerization initiator. Specific examples of such a photopolymerization initiator include the dimers of the oxime compounds described in JP2010-527339A, JP2011-524436A, WO2015/004565A, paragraph Nos. 0412 to 0417 of JP2016-532675A, and paragraph Nos. 0039 to 0055 of WO2017/033680A, the compound (E) and the compound (G) described in JP2013-522445A, and Cmpd 1 to 7 described in WO2016/034963A.

In a case where the coloring composition of the embodiment of the present invention contains a photopolymerization initiator, the content of the photopolymerization initiator is preferably 0.1% to 30% by mass with respect to the total solid content of the coloring composition. The lower limit is, for example, more preferably 0.5% by mass or more, and still more preferably 1% by mass or more. The upper limit is, for example, more preferably 20% by mass or less, and still more preferably 10% by mass or less. The coloring composition may include only one kind or two or more kinds of the photopolymerization initiators. In a case of including two or more kinds of the photopolymerization initiators, the total amount thereof is preferably within the above-mentioned range.

<<Solvent>>

The coloring composition of the embodiment of the present invention preferably contains a solvent. The solvent is preferably an organic solvent. The solvent is not particularly limited as long as it satisfies the solubility of the respective components or the coatability of the coloring composition.

Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate. Examples of ketones include methyl ethyl ketone, cyclohexanone, cyclopentanone, 2-heptanone, and 3-heptanone. Suitable examples of aromatic hydrocarbons include toluene and xylene. In addition, 3-methoxy-N,N-dimethylpropanamide or 3-butoxy-N, N-dimethylpropanamide is also preferable from the viewpoint of improving the solubility. The organic solvents may be used singly or in combination of two or more kinds thereof. However, it is preferable in some cases to reduce aromatic hydrocarbons (benzene, toluene, xylene, ethylbenzene, and the like) (for example, the amount can be set to 50 ppm (parts per million) by mass or less, 10 ppm by mass or less, or 1 ppm by mass or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol monomethyl ether acetate.

In the present invention, a solvent having a small metal content is preferably used as the solvent. For example, the metal content in the solvent is preferably 10 ppb (parts per billion) by mass or less. A solvent in which the metal content is at a level of ppt (parts per trillion) by mass may be used as desired, and such a high-purity solvent is provided by, for example, Toyo Kasei Kogyo Co., Ltd. (The Chemical Daily, Nov. 13, 2015).

Examples of a method of removing impurities such as a metal from the solvent include distillation (for example, molecular distillation and thin-film distillation) and filtration using a filter. The filter pore size of a filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers or a plurality of isomers may be included.

In the present invention, the organic solvent preferably has the content of peroxides of 0.8 mmol/L or less, and more preferably, the organic solvent does not substantially include peroxides.

The content of the solvent is preferably an amount such that the total solid content of the coloring composition is 5% to 80% by mass. The lower limit is preferably 8% by mass or more and more preferably 10% by mass or more. The upper limit is preferably 60% by mass or less, more preferably 50% by mass or less, still more preferably 40% by mass or less, even still more preferably 35% by mass or less, and particularly preferably 30% by mass or less.

<<Curing Accelerator>>

The coloring composition of the embodiment of the present invention may include a curing accelerator for the purpose of improving the hardness of a pattern or lowering a curing temperature. Examples of the curing accelerator include a thiol compound.

Examples of the thiol compound include a polyfunctional thiol compound having two or more mercapto groups in a molecule thereof. The polyfunctional thiol compound may also be added for the purpose of alleviating problems in stability, odor, resolution, developability, adhesiveness, or the like. The polyfunctional thiol compound is preferably secondary alkanethiols and more preferably a compound having a structure represented by Formula (T1).

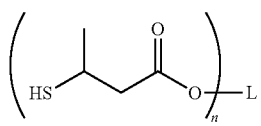

Formula (T1)

(In Formula (T1), n represents an integer of 2 to 4, and L represents a divalent to tetravalent linking group.)

In Formula (T1), it is preferable that L is an aliphatic group having 2 to 12 carbon atoms. In Formula (T1), it is more preferable that n is 2 and L is an alkylene group having 2 to 12 carbon atoms. Specific examples of the polyfunctional thiol compounds include compounds represented by Structural Formulae (T2) to (T4), and the compound represented by Formula (T2) is preferable. These thiol compounds may be used singly or in combination of two or more kinds thereof.

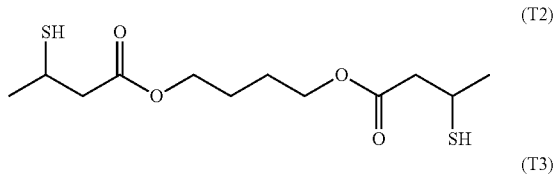
(T2)

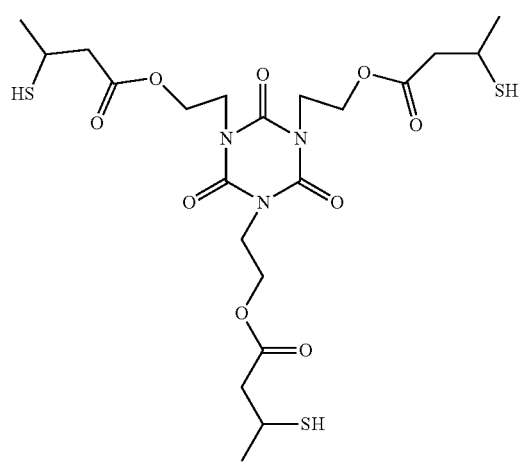
(T3)

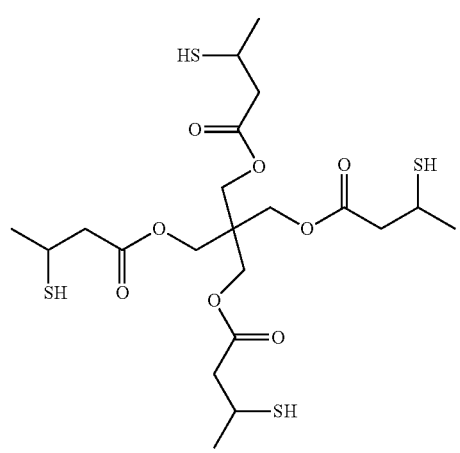
(T4)

Moreover, as the curing accelerator, a methylol-based compound (for example, the compounds exemplified as a crosslinking agent in paragraph No. 0246 of JP2015-034963A), amines, phosphonium salts, amidine salts, amide compounds (each of which are the curing agents described in, for example, paragraph No. 0186 of JP2013-041165A), base generators (for example, the ionic compounds described in JP2014-055114A), isocyanate compounds (for example, the compounds described in paragraph No. 0071 of JP2012-150180A), alkoxysilane compounds (for example, the alkoxysilane compounds having an epoxy group, described in JP2011-253054A), onium salt compounds (for example, the compounds exemplified as an acid generator in paragraph No. 0216 of JP2015-034963A, and the compounds described in JP2009-180949A), or the like can be used.

In a case where the coloring composition of the embodiment of the present invention contains a curing accelerator, the content of the curing accelerator is preferably 0.3% to 8.9% by mass, and more preferably 0.8% to 6.4% by mass with respect to the total solid content of the coloring composition.

<<Pigment Derivative>>

The coloring composition of the embodiment of the present invention preferably contains a pigment derivative. Examples of the pigment derivative include a compound having a structure in which a part of a chromophore is substituted with an acid group, a basic group, or a phthalimidemethyl group.

Examples of the chromophore constituting the pigment derivative include a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, the quinoline-based skeleton, the benzimidazolone-based skeleton, the diketopyrrolopyrrole-based skeleton, the azo-based skeleton, the quinophthalone-based skeleton, the isoindoline-based skeleton, and the phthalocyanine-based skeleton are preferable, and the azo-based skeleton and the benzimidazolone-based skeleton are more preferable. As the acid group contained in the pigment derivative, a sulfo group or a carboxyl group is preferable and the sulfo group is more preferable. As the basic group contained in the pigment derivative, an amino group is preferable and a tertiary amino group is more preferable. With regard to specific examples of the pigment derivative, reference can be made to the description in paragraph Nos. 0162 to 0183 of JP2011-252065A, and the contents thereof are incorporated herein by reference.

In a case where the coloring composition of the embodiment of the present invention contains a pigment derivative, the content of the pigment derivative is preferably 1 to 30 parts by mass, and more preferably 3 to 20 parts by mass with respect to 100 parts by mass of the pigment. The pigment derivative may be used singly or in combination of two or more kinds thereof.

<<Surfactant>>

The coloring composition of the embodiment of the present invention preferably contains a surfactant. As the surfactant, various surfactants such as a fluorine-based surfactant, a nonionic surfactant, a cationic surfactant, an anionic surfactant, and a silicone-based surfactant can be used, and the fluorine-based surfactant is preferable for a reason that coatability can be further improved.

By incorporating the fluorine-based surfactant into the coloring composition of the embodiment of the present invention, liquid characteristics at the time of preparation of a coating liquid are further improved, and thus, the evenness of coating thickness can be further improved. That is, in a case where a film is formed using the coating liquid to which a coloring composition containing the fluorine-based surfactant has been applied, the interface tension between a surface of a coating film and the coating liquid is reduced to improve evenness of the drying with respect to the film. Therefore, formation of a film with a uniform thickness which exhibits little coating unevenness can be more suitably performed.

The fluorine content in the fluorine-based surfactant is preferably 3% to 40% by mass, more preferably 5% to 30% by mass, and particularly preferably 7% to 25% by mass. The fluorine-based surfactant in which the fluorine content is within the above-described range is effective in terms of the evenness of the thickness of the coating film or liquid saving properties and the solubility of the surfactant in the coloring composition is also good.

Examples of the fluorine-based surfactant include MEGAFACE F171, F172, F173, F176, F177, F141, F142, F143, F144, R30, F437, F475, F479, F482, F554, and F780 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S-393, and KH-40 (all manufactured by Asahi Glass Co., Ltd.), and PF636, PF656, PF6320, PF6520, and PF7002 (all manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used.

As the fluorine-based surfactant, an acrylic compound, which has a molecular structure having a functional group containing a fluorine atom and in which by applying heat to the molecular structure, the functional group containing a fluorine atom is broken to volatilize a fluorine atom, can also be suitably used. Examples of the fluorine-based surfactant include MEGAFACE DS series (manufactured by DIC Corporation, The Chemical Daily, Feb. 22, 2016, Nikkei Business Daily, Feb. 23, 2016), for example, MEGAFACE DS-21.

It is also preferable that a polymer of a fluorine atom-containing vinyl ether compound having a fluorinated alkyl group or a fluorinated alkylene ether group and a hydrophilic vinyl ether compound is used as the fluorine-based surfactant. With regard to such a fluorine-based surfactant, reference can be made to the description in JP2016-216602A, the contents of which are incorporated herein by reference.

A block polymer can also be used as the fluorine-based surfactant. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. The following compounds are also exemplified as a fluorine-based surfactant for use in the present invention. In the following formula, % representing the proportion of the repeating unit is % by mole.

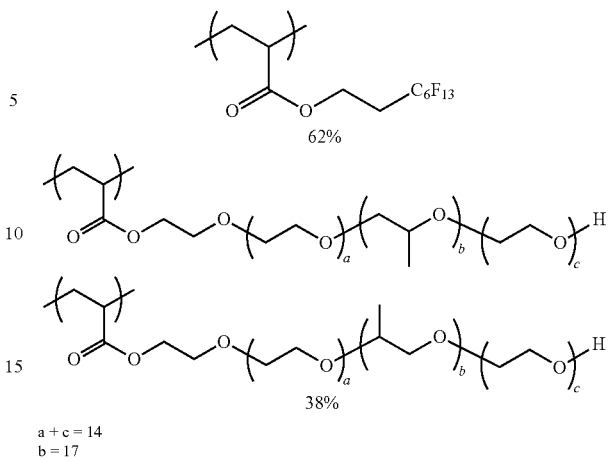

$a + c = 14$
$b = 17$

The weight-average molecular weight of the compounds is preferably 3,000 to 50,000, and is, for example, 14,000.

A fluorine-containing polymer having an ethylenically unsaturated group in a side chain can also be used as the fluorine-based surfactant. Specific examples thereof include the compounds described in paragraph Nos. 0050 to 0090 and paragraph Nos. 0289 to 0295 of JP2010-164965A. Examples of a commercially available product thereof include MEGAFACE RS-101, RS-102, RS-718-K, and RS-72-K, all manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin Chemical Industry Co., Ltd.).

Specific examples of the cationic surfactant include KP341 (manufactured by Shin-Etsu Chemical Co., Ltd.), POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and SANDET BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The content of the surfactant is preferably 0.001% to 2.0% by mass, and more preferably 0.005% to 1.0% by mass with respect to the total solid content of the coloring composition. The surfactant may be used singly or in combination of two or more kinds thereof. In a case where two or more kinds of surfactants are included, the total amount thereof is preferably within the range.

<<Ultraviolet Absorber>>

The coloring composition of the embodiment of the present invention can contain an ultraviolet absorber. As the ultraviolet absorber, a conjugated diene compound, an aminobutadiene compound, a methyldiebenzoyl compound, a coumarin compound, a salicylate compound, a benzophenone compound, a benzotriazole compound, an acrylonitrile compound, a hydroxyphenyltriazine compound, or the like can be used. With regard to details thereof, reference can be made to the description in paragraph Nos. 0052 to 0072 of JP2012-208374A and paragraph Nos. 0317 to 0334 of JP2013-068814A, and the contents of which are incorporated herein by reference. Specific examples of the ultraviolet absorber include a compound having the following structure. Examples of a commercially available product of the ultraviolet absorber include UV-503 (manufactured by Daito Chemical Co., Ltd). In addition, as the benzotriazole compound, MYUA series manufactured by Miyoshi Oil & Fat Co., Ltd. (The Chemical Daily, Feb. 1, 2016) may be used.

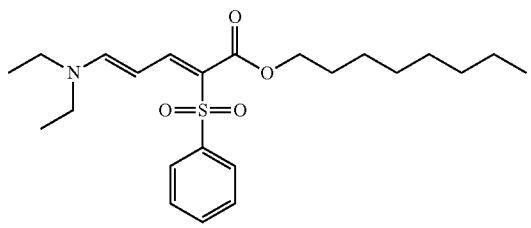 [SMILES: CCCCCCCCOC(=O)/C(=C/C=C/N(CC)CC)S(=O)(=O)c1ccccc1]

In a case where the coloring composition of the embodiment of the present invention contains an ultraviolet absorber, the content of the ultraviolet absorber is preferably 0.1% to 10% by mass, more preferably 0.1% to 5% by mass, and particularly preferably 0.1% to 3% by mass with respect to the total solid content of the coloring composition. Further, the ultraviolet absorber may be used singly or in combination of two or more kinds thereof. In a case where two or more kinds of the ultraviolet absorbers are included, the total amount thereof is preferably within the range.

<<Silane Coupling Agent>>

The coloring composition of the embodiment of the present invention can contain a silane coupling agent. In the present invention, the silane coupling agent means a silane compound having a hydrolyzable group and another functional group. Further, the hydrolyzable group refers to a substituent that can be directly bonded to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having at least one selected from a vinyl group, an epoxy group, a styrene group, a methacryl group, an amino group, an isocyanurate group, a ureido group, a mercapto group, a sulfide group, or an isocyanate group, and an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to details of the silane coupling agent, reference can be made to the description in paragraph Nos. 0155 to 0158 of JP2013-254047A, and the contents thereof are incorporated herein by reference.

In a case where the coloring composition of the embodiment of the present invention contains a silane coupling agent, the content of the silane coupling agent is preferably 0.001% to 20% by mass, more preferably 0.01% to 10% by mass, and particularly preferably 0.1% to 5% by mass with respect to the total solid content of the coloring composition. The coloring composition of the embodiment of the present invention may include one kind or two or more kinds of the silane coupling agents. In a case where the coloring composition includes two or more kinds of the silane coupling agents, the total amount thereof is preferably within the range.

<<Polymerization Inhibitor>>

The coloring composition of the embodiment of the present invention can contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and an N-nitrosophenylhydroxylamine salt (an ammonium salt, a cerous salt, or the like).

In a case where the coloring composition of the embodiment of the present invention contains a polymerization inhibitor, the content of the polymerization inhibitor is preferably 0.01% to 5% by mass with respect to the total solid content of the coloring composition. The coloring composition of the embodiment of the present invention may include one kind or two or more kinds of the polymerization inhibitors. In a case where two or more kinds of polymerization inhibitors are included, the total amount thereof is preferably within the range.

<<Other Additives>>

Various additives such as a filler, an adhesion promoter, an antioxidant, and an aggregation inhibitor can be blended into the coloring composition of the embodiment of the present invention, as desired. Examples of these additives include the additives described in paragraph Nos. 0155 and 0156 of JP2004-295116A, and the contents thereof are incorporated herein by reference. Further, as the antioxidant, for example, a phenol compound, a phosphorus-based compound (for example, the compounds described in paragraph No. 0042 of JP2011-090147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used singly or in combination of two or more kinds thereof. The coloring composition of the embodiment of the present invention can contain the sensitizers or the light stabilizers described in paragraph No. 0078 of JP2004-295116A, or the thermal polymerization inhibitors described in paragraph No. 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm by mass or less, and more preferably 0.01 to 10 ppm by mass. Further, the total amount of the inorganic metal salts in the coloring composition is preferably 100 ppm by mass or less and more preferably 0.5 to 50 ppm by mass.

The moisture content in the coloring composition of the embodiment of the present invention is usually 3% by mass or less, preferably 0.01% to 1.5% by mass, and more preferably in the range of 0.1% to 1.0% by mass. The moisture content can be measured by a Karl Fischer method.

The concentration of solid contents of the coloring composition of the embodiment of the present invention is preferably 5% to 40% by mass. The upper limit is preferably 35% by mass or less and more preferably 30% by mass or less. The lower limit is preferably 8% by mass or more and more preferably 10% by mass or more. The smaller the concentration of solid contents of the coloring composition, the easier it is to form a cured film having a thin film thickness. According to the present invention, since it is possible to form a cured film having a high color value (specifically, a red color value) even with a thin film thickness, a cured film having desired spectral characteristics while being a thin-film can be suitably formed.

The coloring composition of the embodiment of the present invention can be used after its viscosity is adjusted for the purposes of adjusting the state of a film surface (flatness or the like), adjusting a film thickness, or the like. The value of the viscosity can be appropriately selected as desired, and is, for example, preferably 0.3 to 50 mPa×s, and more preferably 0.5 to 20 mPa×s at 25° C. As for a method for measuring the viscosity, the viscosity can be measured, for example, with a temperature being adjusted to 25° C., using a viscometer RE85L (rotor: 1°34'×R24, measurement range of 0.6 to 1,200 mPa×s) manufactured by Toki Sangyo Co., Ltd.

A storage container for the coloring composition of the embodiment of the present invention is not particularly limited, and a known storage container can be used. Further, as the storage container, it is also preferable to use a multilayer bottle having an inner wall constituted with six layers from six kinds of resins or a bottle having a 7-layer structure from 6 kinds of resins for the purpose of suppressing incorporation of impurities into raw materials or compositions. Examples of such a container include the containers described in JP2015-123351A.

The coloring composition of the embodiment of the present invention can be preferably used as a composition for forming a colored layer in a color filter. In particular, the coloring composition of the embodiment of the present invention can be preferably used as a composition for forming a red colored layer of a color filter.

In a case where the coloring composition of the embodiment of the present invention is used as a color filter in applications for a liquid crystal display device, the voltage holding ratio of a liquid crystal display element comprising a color filter is preferably 70% or more, and more preferably 90% or more. Known means for obtaining a high voltage holding ratio can be incorporated as appropriate, and examples of typical means include use of high-purity materials (for example, reduction in ionic impurities) and control of the amount of acidic functional groups in a composition. The voltage holding ratio can be measured by, for example, the methods described in paragraph 0243 of JP2011-008004A and paragraphs 0123 to 0129 of JP2012-224847A.

<Method for Preparing Coloring Composition>

The coloring composition of the embodiment of the present invention can be prepared by mixing the above-mentioned components. In the preparation of the coloring composition, all the components may be dissolved and/or dispersed at the same time in a solvent to prepare the coloring composition, or the respective components may be appropriately left in two or more solutions or dispersion liquids and mixed to prepare the coloring composition upon use (during coating), as desired.

Furthermore, in the preparation of the coloring composition, a process for dispersing the pigment is preferably included. In the process for dispersing the pigment, examples of a mechanical force that is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling process may be performed. With regard to the materials, the equipment, the process conditions, and the like used in the salt milling process, reference can be made to, for example, the description in JP2015-194521A and JP2012-046629A.

It is preferable that in the preparation of the coloring composition, a composition formed by mixing the respective components is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density and/or an ultrahigh molecular weight) such as polyethylene and polypropylene (PP). Among these materials, polypropylene (including a high-density polypropylene) and nylon are preferable.

The pore size of the filter is suitably approximately 0.01 to 7.0 μm, preferably approximately 0.01 to 3.0 μm, and more preferably approximately 0.05 to 0.5 μm.

In addition, a fibrous filter material is also preferably used as the filter. Examples of the fibrous filter material include a polypropylene fiber, a nylon fiber, and a glass fiber. Examples of a filter using the fibrous filter material include filter cartridges of SBP type series (SBP008 and the like), TPR type series (TPR002, TPROO5, and the like), or SHPX type series (SHPX003 and the like), all manufactured by Roki Techno Co., Ltd.

In a case of using a filter, different filters may be combined. Here, the filtration with each of the filters may be performed once or may be performed twice or more times.

For example, filters having different pore sizes within the above-mentioned range may be combined. With regard to the pore size of the filter herein, reference can be made to nominal values of filter manufacturers. A commercially available filter can be selected from, for example, various filters provided by Nihon Pall Corporation (DFA4201NXEY and the like), Toyo Roshi Kaisha, Ltd., Nihon Entegris K. K. (formerly Nippon Microlith Co., Ltd.), Kitz Micro Filter Corporation, and the like.

In addition, the filtration through the first filter may be performed with only a dispersion liquid, the other components may be mixed therewith, and then the filtration through the second filter may be performed. As the second filter, a filter formed of the same material as that of the first filter, or the like can be used.

<Cured Film>

The cured film of an embodiment of the present invention is a cured film obtained from the above-mentioned coloring composition of the embodiment of the present invention. The film thickness of the cured film can be appropriately adjusted depending on purposes. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

<Pattern Forming Method>

Next, the pattern forming method of an embodiment of the present invention will be described. The pattern forming method of the embodiment of the present invention includes a step of forming a coloring composition layer on a support using the coloring composition of the embodiment of the present invention and a step of forming a pattern onto the coloring composition layer by a photolithography method or a dry etching method.

Pattern formation by the photolithography method preferably includes a step of forming a coloring composition layer on a support with the coloring composition, a step of patternwise exposing the coloring composition layer, and a step of removing an unexposed area of the coloring composition layer by development to form a pattern. A step of baking the coloring composition layer (pre-baking step) and a step of baking the developed pattern (post-baking step) may be provided, as desired. In addition, pattern formation by the dry etching method preferably includes a step of forming a coloring composition layer on a support with the coloring composition, and curing the coloring composition layer to form a cured product layer, a step of forming a resist layer on the cured product layer, a step of obtaining a resist pattern by patterning the resist layer, and a step of subjecting the cured product layer to dry etching with the resist pattern as an etching mask to form a pattern.

Hereinafter, the respective steps will be described.

<<Step of Forming Coloring Composition Layer>>

In the step of forming a coloring composition layer, the coloring composition layer is formed on a support, using the coloring composition. The support is not particularly limited, and can be appropriately selected depending on applications. Examples of the support include a glass substrate, a substrate for a solid-state imaging element, on which a solid-state imaging element (light-receiving element) such as CCD and CMOS is provided, and a silicon substrate. Incidentally, an undercoat layer may be provided on the substrate, as desired, so as to improve adhesion to an upper layer, prevent the diffusion of materials, or planarize the surface.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials. The pre-baking time is preferably 10 seconds to 300 seconds, more preferably 40 to 250 seconds, and still more preferably 80 to 220 seconds.

Drying can be performed using a hot plate, an oven, or the like.

(Case of Forming Pattern by Photolithography Method)

<<Exposing Step>>

Next, the coloring composition layer formed on the support is patternwise exposed (exposing step). For example, the coloring composition layer can be subjected to patternwise exposure by performing exposure using an exposure device such as a stepper through a mask having a predetermined mask pattern. Thus, the exposed portion can be cured. As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. Further, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<Developing Step>>

Next, the unexposed areas of the coloring composition layer are removed by development to form a pattern. The removal of the unexposed areas of the coloring composition layer by development can be carried out using a developer. Thus, the coloring composition layer of the unexposed areas in the exposing step is eluted into the developer, and as a result, only a photocured portion remains. As the developer, an organic alkali developer causing no damage on a base of solid-state imaging element, circuit, or the like is preferable.

The temperature of the developer is preferably, for example, 20° C. to 30° C. The development time is preferably 20 to 180 seconds. Further, in order to improve residue removing properties, a step of removing the developer by shaking per 60 seconds and supplying a fresh developer may be repeated multiple times.

As the developer, an aqueous alkaline solution obtained by diluting an alkali agent with pure water is preferably used. Examples of the alkali agent include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass and more preferably 0.01% to 1% by mass. Moreover, the developer may further include a surfactant. Examples of the surfactant include the surfactants described above, and the surfactant is preferably a nonionic surfactant. From the viewpoints of transportation, storage, and the like, the developer may be first produced as a concentrated liquid and then diluted to a concentration required upon the use. The dilution ratio is not particularly limited, and can be set to, for example, a range of 1.5 to 100 times. In addition, in a case where a developer including such an aqueous alkaline solution is used, it is preferable to perform washing (rinsing) with pure water after development.

After the development, it is preferable that a heating treatment (post-baking) after carrying out drying. The post-baking is a heating treatment after development in order to complete curing, and the heating temperature is preferably, for example, 100° C. to 240° C., and more preferably 200° C. to 240° C. In addition, in a case where a support on which the cured film is formed includes an organic electroluminescence (organic EL) element, an image sensor having a photo-electric conversion film constituted with organic materials, or the like, the post-baking temperature is preferably 150° C. or lower. The lower limit can be set to, for example, 50° C. or higher. The post-baking can be performed continuously or batchwise by using a heating means such as a hot plate, a convection oven (hot-air circulating dryer), and a high-frequency heater so that the film after development (cured film) satisfies the conditions. The Young's modulus of the film (cured film) after post-baking is preferably 0.5 to 20 GPa and more preferably 2.5 to 15 GPa.

The cured film preferably has high flatness. Specifically, the surface roughness Ra is preferably 100 nm or less, more preferably 40 nm or less, and still more preferably 15 nm or less. The lower limit is not specified, but is preferably, for example, 0.1 nm or more. The surface roughness can be measured, for example, using an atomic force microscope (AFM) Dimension 3100 manufactured by Veeco Instruments, Inc.

In addition, the contact angle of water on the cured film can be appropriately set to a preferred value and is typically in the range of 50 to 110°. The contact angle can be measured, for example, using a contact angle meter CV-DT-A Model (manufactured by Kyowa Interface Science Co., Ltd.).

A higher volume resistivity value of each pattern (pixel) is desired. Specifically, the volume resistivity value of the pixel is preferably $10^9$ Ω×cm or more and more preferably $10^{11}$ Ω×cm or more. The upper limit is not specified, but is, for example, preferably $10^{14}$ Ω×cm or less. The volume resistivity value of the pixel can be measured, for example, using an ultra high resistance meter 5410 (manufactured by Advantest Corporation).

(Case of Forming Pattern by Dry Etching Method)

Pattern formation by the dry etching method can be performed by a method in which a coloring composition layer formed by applying a coloring composition onto a support is cured to form a cured product layer, a patterned resist layer is then formed on the cured product layer, and the cured product layer is then dry-etched with an etching gas using the patterned resist layer as a mask. It is preferable that a positive type or negative type photosensitive composition is applied onto a cured product layer, and dried to form a resist layer. As the composition used for formation of the resist layer, a positive type photosensitive composition is preferable. As the positive type photosensitive composition, a photosensitive composition which is sensitive to radiations such as ultraviolet rays (g-rays, h-rays, and i-rays), far ultraviolet rays including KrF-rays, ArF-rays, and the like, electron beams, ion beams, and X-rays is preferable. The above-mentioned positive type photosensitive composition is preferably a photosensitive composition which is sensitive to KrF-rays, ArF-rays, i-rays, and X-rays, and from the viewpoint of micromachining, a photosensitive composition which is sensitive to KrF-rays is more preferable. As the positive type photosensitive composition, the positive type resist compositions described in JP2009-237173A or JP2010-134283A are suitably used.

<Color Filter>

Next, the color filter of an embodiment of the present invention will be described. The color filter of the embodiment of the present invention has the above-mentioned cured film of the embodiment of the present invention. In the color filter of the embodiment of the present invention, the film thickness of the cured film can be appropriately adjusted depending on the purposes. The film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more. The color filter of the embodiment of the present invention can be used for a solid-state imaging element such as a charge coupled device (CCD) and a complementary metal-oxide semiconductor (CMOS), an image display device, or the like.

<Solid-State Imaging Element>

The solid-state imaging element of an embodiment of the present invention has the above-mentioned cured film of the embodiment of the present invention. The configuration of the solid-state imaging element of the embodiment of the present invention is not particularly limited as long as the solid-state imaging element is configured to include the cured film of the embodiment of the present invention and function as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. In addition, the solid-state imaging element may also be configured, for example, such that it has a light collecting means (for example, a microlens, which is the same hereinafter) on a device-protective film under a color filter (a side closer to the substrate), or has a light collecting means on a color filter. Further, the color filter may have a structure in which a cured film forming each coloring pixel is embedded in a space partitioned in a lattice shape by a partition wall. The partition wall in this case preferably has a low refractive index for each coloring pixel. Examples of an imaging device having such a structure include the devices described in JP2012-227478A and JP2014-179577A. An imaging device comprising the solid-state imaging element of the embodiment of the present invention can also be used as a vehicle camera or a monitoring camera, in addition to a digital camera or electronic equipment (mobile phones or the like) having an imaging function.

<Image Display Device>

The cured film of the embodiment of the present invention can be used for an image display device such as a liquid crystal display device and an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in more detail with reference to examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below. In addition, "parts" and "%" are on a mass basis unless otherwise specified.

<Measurement of Weight-Average Molecular Weight>

The weight-average molecular weight of a resin was measured by gel permeation chromatography (GPC) according to the following conditions.

Types of columns: Columns formed by connection of TOSOH TSKgel Super HZM-H, TOSOH TSKgel Super HZ4000, and TOSOH TSKgel Super HZ2000
Developing solvent: Tetrahydrofuran
Column temperature: 40° C.
Flow amount (amount of a sample to be injected): 1.0 μL (sample concentration: 0.1% by mass)
Device name: HLC-8220GPC manufactured by Tosoh Corporation
Detector: Refractive index (RI) detector
Calibration curve base resin: Polystyrene resin <Preparation of Dispersion Liquid>

Raw materials described in the following tables were mixed, and then 230 parts by mass of zirconia beads having a diameter of 0.3 mm were added thereto to perform a dispersion treatment for 5 hours using a paint shaker. The beads were separated by filtration, and a dispersion liquid was produced. The numerical values described in the following tables indicate parts by mass.

<Dispersion Stability Evaluation>

The viscosity of the dispersion liquid obtained as above was measured by "RE-85L" manufactured by TOKI SANGYO CO., LTD. After that, the dispersion liquid was left to stand under the conditions of 45° C. and 3 days, and then the viscosity thereof was measured again. Dispersion stability was evaluated according to the following evaluation standard from a viscosity difference (ΔVis) before and after leaving to stand. It can be said that the smaller the numerical value of the viscosity difference (ΔVis), the better the dispersion stability. The viscosity of the dispersion liquid was measured in a state in which the temperature was adjusted to 25° C.

A: ΔVis is 0.5 or less
B: ΔVis is more than 0.5 and 1.0 or less
C: ΔVis is more than 1.0 and 2.0 or less
D: ΔVis is more than 2.0

TABLE 4

|  | Pigment | | Pigment derivative | | Dispersant | | Solvent | | |
| --- | --- | --- | --- | --- | --- | --- | --- | --- | --- |
|  | Type | Parts by mass | Type | Parts by mass | Type | Parts by mass | Type | Parts by mass | Dispersion stability |
| Dispersion liquid 1 | DPP-3 | 10.36 | Derivative-1 | 2.6 | P-1 | 15.12 | PGMEA | 71.92 | A |
| Dispersion liquid 2 | DPP-3 | 10.36 | Derivative-1 | 2.6 | P-1 | 11.00 | PGMEA | 71.92 | B |
| Dispersion liquid 3 | DPP-8 | 10.36 | Derivative-1 | 2.6 | P-1 | 15.12 | PGMEA | 71.92 | A |
| Dispersion liquid 4 | DPP-8 | 10.36 | Derivative-1 | 2.6 | P-1 | 11.00 | PGMEA | 71.92 | B |
| Dispersion liquid 5 | DPP-10 | 10.36 | Derivative-1 | 2.6 | P-1 | 15.12 | PGMEA | 71.92 | A |
| Dispersion liquid 6 | DPP-21 | 10.36 | Derivative-1 | 2.6 | P-1 | 15.12 | PGMEA | 71.92 | A |
| Dispersion liquid 7 | DPP-23 | 10.36 | Derivative-1 | 2.6 | P-1 | 15.12 | PGMEA | 71.92 | B |
| Dispersion liquid 8 | DPP-28 | 10.36 | Derivative-1 | 2.6 | P-1 | 15.12 | PGMEA | 71.92 | A |
| Dispersion liquid 9 | DPP-28 | 10.36 | Derivative-1 | 2.6 | P-1 | 11.00 | PGMEA | 71.92 | B |
| Dispersion liquid 10 | DPP-37 | 10.36 | Derivative-1 | 2.6 | P-1 | 15.12 | PGMEA | 71.92 | B |
| Dispersion liquid 11 | DPP-37 | 10.36 | Derivative-1 | 2.6 | P-1 | 11.00 | PGMEA | 71.92 | B |
| Dispersion liquid 12 | DPP-41 | 10.36 | Derivative-1 | 2.6 | P-1 | 15.12 | PGMEA | 71.92 | A |
| Dispersion liquid 13 | DPP-41 | 10.36 | Derivative-1 | 2.6 | P-1 | 11.00 | PGMEA | 71.92 | B |
| Dispersion liquid 14 | DPP-46 | 10.36 | Derivative-1 | 2.6 | P-1 | 15.12 | PGMEA | 71.92 | A |
| Dispersion liquid 15 | DPP-46 | 10.36 | Derivative-1 | 2.6 | P-1 | 11.00 | PGMEA | 71.92 | A |

TABLE 4-continued

| | Pigment | | Pigment derivative | | Dispersant | | Solvent | | Dispersion stability |
|---|---|---|---|---|---|---|---|---|---|
| | Type | Parts by mass | Type | Parts by mass | Type | Parts by mass | Type | Parts by mass | |
| Dispersion liquid 16 | DPP-47 | 10.36 | Derivative-1 | 2.6 | P-1 | 15.12 | PGMEA | 71.92 | A |
| Dispersion liquid 17 | DPP-47 | 10.36 | Derivative-1 | 2.6 | P-1 | 11.00 | PGMEA | 71.92 | A |
| Dispersion liquid 18 | DPP-51 | 10.36 | Derivative-1 | 2.6 | P-1 | 15.12 | PGMEA | 71.92 | A |
| Dispersion liquid 19 | DPP-51 | 10.36 | Derivative-1 | 2.6 | P-1 | 11.00 | PGMEA | 71.92 | A |
| Dispersion liquid 20 | DPP-52 | 10.36 | Derivative-1 | 2.6 | P-1 | 15.12 | PGMEA | 71.92 | A |
| Dispersion liquid 21 | DPP-54 | 10.36 | Derivative-1 | 2.6 | P-1 | 15.12 | PGMEA | 71.92 | A |
| Dispersion liquid 22 | DPP-59 | 10.36 | Derivative-1 | 2.6 | P-1 | 15.12 | PGMEA | 71.92 | A |
| Dispersion liquid 23 | DPP-61 | 10.36 | Derivative-1 | 2.6 | P-1 | 15.12 | PGMEA | 71.92 | A |
| Dispersion liquid 24 | DPP-63 | 10.36 | Derivative-1 | 2.6 | P-1 | 15.12 | PGMEA | 71.92 | A |
| Dispersion liquid 25 | DPP-63 | 10.36 | Derivative-1 | 2.6 | P-1 | 11.00 | PGMEA | 71.92 | B |
| Dispersion liquid 26 | DPP-68 | 10.36 | Derivative-1 | 2.6 | P-1 | 15.12 | PGMEA | 71.92 | A |
| Dispersion liquid 27 | DPP-68 | 10.36 | Derivative-1 | 2.6 | P-1 | 11.00 | PGMEA | 71.92 | A |
| Dispersion liquid 28 | DPP-69 | 10.36 | Derivative-1 | 2.6 | P-1 | 15.12 | PGMEA | 71.92 | A |
| Dispersion liquid 29 | DPP-73 | 10.36 | Derivative-1 | 2.6 | P-1 | 15.12 | PGMEA | 71.92 | A |
| Dispersion liquid 30 | DPP-74 | 10.36 | Derivative-1 | 2.6 | P-1 | 15.12 | PGMEA | 71.92 | A |
| Dispersion liquid 31 | DPP-76 | 10.36 | Derivative-1 | 2.6 | P-1 | 15.12 | PGMEA | 71.92 | A |
| Dispersion liquid 32 | DPP-3 | 10.36 | Derivative-1 | 2.6 | P-2 | 15.12 | PGMEA | 71.92 | B |
| Dispersion liquid 33 | DPP-3 | 10.36 | Derivative-1 | 2.6 | P-2 | 11.00 | PGMEA | 71.92 | C |
| Dispersion liquid 34 | DPP-8 | 10.36 | Derivative-1 | 2.6 | P-2 | 15.12 | PGMEA | 71.92 | B |
| Dispersion liquid 35 | DPP-8 | 10.36 | Derivative-1 | 2.6 | P-2 | 11.00 | PGMEA | 71.92 | C |
| Dispersion liquid 36 | DPP-10 | 10.36 | Derivative-1 | 2.6 | P-2 | 15.12 | PGMEA | 71.92 | A |
| Dispersion liquid 37 | DPP-21 | 10.36 | Derivative-1 | 2.6 | P-2 | 15.12 | PGMEA | 71.92 | A |
| Dispersion liquid 38 | DPP-23 | 10.36 | Derivative-1 | 2.6 | P-2 | 15.12 | PGMEA | 71.92 | B |
| Dispersion liquid 39 | DPP-28 | 10.36 | Derivative-1 | 2.6 | P-2 | 15.12 | PGMEA | 71.92 | A |
| Dispersion liquid 40 | DPP-28 | 10.36 | Derivative-1 | 2.6 | P-2 | 11.00 | PGMEA | 71.92 | B |

TABLE 5

| | Pigment | | Pigment derivative | | Dispersant | | Solvent | | Dispersion stability |
|---|---|---|---|---|---|---|---|---|---|
| | Type | Parts by mass | Type | Parts by mass | Type | Parts by mass | Type | Parts by mass | |
| Dispersion liquid 41 | DPP-37 | 10.36 | Derivative-1 | 2.6 | P-2 | 15.12 | PGMEA | 71.92 | B |
| Dispersion liquid 42 | DPP-37 | 10.36 | Derivative-1 | 2.6 | P-2 | 11.00 | PGMEA | 71.92 | C |
| Dispersion liquid 43 | DPP-41 | 10.36 | Derivative-1 | 2.6 | P-2 | 15.12 | PGMEA | 71.92 | A |
| Dispersion liquid 44 | DPP-41 | 10.36 | Derivative-1 | 2.6 | P-2 | 11.00 | PGMEA | 71.92 | B |
| Dispersion liquid 45 | DPP-46 | 10.36 | Derivative-1 | 2.6 | P-2 | 15.12 | PGMEA | 71.92 | A |
| Dispersion liquid 46 | DPP-46 | 10.36 | Derivative-1 | 2.6 | P-2 | 11.00 | PGMEA | 71.92 | B |
| Dispersion liquid 47 | DPP-47 | 10.36 | Derivative-1 | 2.6 | P-2 | 15.12 | PGMEA | 71.92 | A |
| Dispersion liquid 48 | DPP-47 | 10.36 | Derivative-1 | 2.6 | P-2 | 11.00 | PGMEA | 71.92 | B |
| Dispersion liquid 49 | DPP-51 | 10.36 | Derivative-1 | 2.6 | P-2 | 15.12 | PGMEA | 71.92 | A |
| Dispersion liquid 50 | DPP-51 | 10.36 | Derivative-1 | 2.6 | P-2 | 11.00 | PGMEA | 71.92 | B |
| Dispersion liquid 51 | DPP-52 | 10.36 | Derivative-1 | 2.6 | P-2 | 15.12 | PGMEA | 71.92 | B |
| Dispersion liquid 52 | DPP-54 | 10.36 | Derivative-1 | 2.6 | P-2 | 15.12 | PGMEA | 71.92 | B |
| Dispersion liquid 53 | DPP-59 | 10.36 | Derivative-1 | 2.6 | P-2 | 15.12 | PGMEA | 71.92 | A |
| Dispersion liquid 54 | DPP-61 | 10.36 | Derivative-1 | 2.6 | P-2 | 15.12 | PGMEA | 71.92 | A |
| Dispersion liquid 55 | DPP-63 | 10.36 | Derivative-1 | 2.6 | P-2 | 15.12 | PGMEA | 71.92 | B |
| Dispersion liquid 56 | DPP-63 | 10.36 | Derivative-1 | 2.6 | P-2 | 11.00 | PGMEA | 71.92 | B |
| Dispersion liquid 57 | DPP-68 | 10.36 | Derivative-1 | 2.6 | P-2 | 15.12 | PGMEA | 71.92 | A |
| Dispersion liquid 58 | DPP-68 | 10.36 | Derivative-1 | 2.6 | P-2 | 11.00 | PGMEA | 71.92 | A |
| Dispersion liquid 59 | DPP-69 | 10.36 | Derivative-1 | 2.6 | P-2 | 15.12 | PGMEA | 71.92 | A |
| Dispersion liquid 60 | DPP-73 | 10.36 | Derivative-1 | 2.6 | P-2 | 15.12 | PGMEA | 71.92 | A |
| Dispersion liquid 61 | DPP-74 | 10.36 | Derivative-1 | 2.6 | P-2 | 15.12 | PGMEA | 71.92 | A |
| Dispersion liquid 62 | DPP-76 | 10.36 | Derivative-1 | 2.6 | P-2 | 15.12 | PGMEA | 71.92 | A |
| Dispersion liquid 63 | DPP-3 | 10.36 | Derivative-1 | 2.6 | P-3 | 15.12 | PGMEA | 71.92 | B |
| Dispersion liquid 64 | DPP-3 | 10.36 | Derivative-1 | 2.6 | P-3 | 11.00 | PGMEA | 71.92 | C |
| Dispersion liquid 65 | DPP-8 | 10.36 | Derivative-1 | 2.6 | P-3 | 15.12 | PGMEA | 71.92 | B |
| Dispersion liquid 66 | DPP-8 | 10.36 | Derivative-1 | 2.6 | P-3 | 11.00 | PGMEA | 71.92 | C |
| Dispersion liquid 67 | DPP-10 | 10.36 | Derivative-1 | 2.6 | P-3 | 15.12 | PGMEA | 71.92 | A |
| Dispersion liquid 68 | DPP-21 | 10.36 | Derivative-1 | 2.6 | P-3 | 15.12 | PGMEA | 71.92 | A |
| Dispersion liquid 69 | DPP-23 | 10.36 | Derivative-1 | 2.6 | P-3 | 15.12 | PGMEA | 71.92 | B |
| Dispersion liquid 70 | DPP-28 | 10.36 | Derivative-1 | 2.6 | P-3 | 15.12 | PGMEA | 71.92 | A |
| Dispersion liquid 71 | DPP-28 | 10.36 | Derivative-1 | 2.6 | P-3 | 11.00 | PGMEA | 71.92 | B |
| Dispersion liquid 72 | DPP-37 | 10.36 | Derivative-1 | 2.6 | P-3 | 15.12 | PGMEA | 71.92 | B |
| Dispersion liquid 73 | DPP-37 | 10.36 | Derivative-1 | 2.6 | P-3 | 11.00 | PGMEA | 71.92 | C |
| Dispersion liquid 74 | DPP-41 | 10.36 | Derivative-1 | 2.6 | P-3 | 15.12 | PGMEA | 71.92 | A |
| Dispersion liquid 75 | DPP-41 | 10.36 | Derivative-1 | 2.6 | P-3 | 11.00 | PGMEA | 71.92 | B |
| Dispersion liquid 76 | DPP-46 | 10.36 | Derivative-1 | 2.6 | P-3 | 15.12 | PGMEA | 71.92 | A |
| Dispersion liquid 77 | DPP-46 | 10.36 | Derivative-1 | 2.6 | P-3 | 11.00 | PGMEA | 71.92 | B |
| Dispersion liquid 78 | DPP-46 | 10.36 | Derivative-1 | 1.3 | P-3 | 15.12 | PGMEA | 71.92 | A |

TABLE 5-continued

|  | Pigment | | Pigment derivative | | Dispersant | | Solvent | | Dispersion stability |
|---|---|---|---|---|---|---|---|---|---|
|  | Type | Parts by mass | Type | Parts by mass | Type | Parts by mass | Type | Parts by mass |  |
| Dispersion liquid 79 | DPP-46 | 10.36 | Derivative-1 | 3.9 | P-3 | 15.12 | PGMEA | 71.92 | A |
| Dispersion liquid 80 | DPP-46 | 10.36 | Derivative-1 | 2.6 | P-3 | 15.12 | PGME | 71.92 | A |

TABLE 6

|  | Pigment | | Pigment derivative | | Dispersant | | Solvent | | Dispersion stability |
|---|---|---|---|---|---|---|---|---|---|
|  | Type | Parts by mass | Type | Parts by mass | Type | Parts by mass | Type | Parts by mass |  |
| Dispersion liquid 81 | DPP-47 | 10.36 | Derivative-1 | 2.6 | P-3 | 15.12 | PGMEA | 71.92 | A |
| Dispersion liquid 82 | DPP-47 | 10.36 | Derivative-1 | 2.6 | P-3 | 11.00 | PGMEA | 71.92 | B |
| Dispersion liquid 83 | DPP-51 | 10.36 | Derivative-1 | 2.6 | P-3 | 15.12 | PGMEA | 71.92 | A |
| Dispersion liquid 84 | DPP-51 | 10.36 | Derivative-1 | 2.6 | P-3 | 11.00 | PGMEA | 71.92 | B |
| Dispersion liquid 85 | DPP-52 | 10.36 | Derivative-1 | 2.6 | P-3 | 15.12 | PGMEA | 71.92 | B |
| Dispersion liquid 86 | DPP-54 | 10.36 | Derivative-1 | 2.6 | P-3 | 15.12 | PGMEA | 71.92 | B |
| Dispersion liquid 87 | DPP-59 | 10.36 | Derivative-1 | 2.6 | P-3 | 15.12 | PGMEA | 71.92 | A |
| Dispersion liquid 88 | DPP-61 | 10.36 | Derivative-1 | 2.6 | P-3 | 15.12 | PGMEA | 71.92 | A |
| Dispersion liquid 89 | DPP-63 | 10.36 | Derivative-1 | 2.6 | P-3 | 15.12 | PGMEA | 71.92 | B |
| Dispersion liquid 90 | DPP-63 | 10.36 | Derivative-1 | 2.6 | P-3 | 11.00 | PGMEA | 71.92 | B |
| Dispersion liquid 91 | DPP-68 | 10.36 | Derivative-1 | 2.6 | P-3 | 15.12 | PGMEA | 71.92 | A |
| Dispersion liquid 92 | DPP-68 | 10.36 | Derivative-1 | 2.6 | P-3 | 11.00 | PGMEA | 71.92 | A |
| Dispersion liquid 93 | DPP-69 | 10.36 | Derivative-1 | 2.6 | P-3 | 15.12 | PGMEA | 71.92 | A |
| Dispersion liquid 94 | DPP-73 | 10.36 | Derivative-1 | 2.6 | P-3 | 15.12 | PGMEA | 71.92 | A |
| Dispersion liquid 95 | DPP-74 | 10.36 | Derivative-1 | 2.6 | P-3 | 15.12 | PGMEA | 71.92 | A |
| Dispersion liquid 96 | DPP-76 | 10.36 | Derivative-1 | 2.6 | P-3 | 15.12 | PGMEA | 71.92 | A |
| Dispersion liquid 97 | DPP-46 | 10.36 | Derivative-1 | 2.6 | P-4 | 15.12 | PGMEA | 71.92 | A |
| Dispersion liquid 98 | DPP-47 | 10.36 | Derivative-1 | 2.6 | P-4 | 15.12 | PGMEA | 71.92 | A |
| Dispersion liquid 99 | DPP-51 | 10.36 | Derivative-1 | 2.6 | P-4 | 15.12 | PGMEA | 71.92 | A |
| Dispersion liquid 100 | DPP-63 | 10.36 | Derivative-1 | 2.6 | P-4 | 15.12 | PGMEA | 71.92 | A |
| Dispersion liquid 101 | DPP-68 | 10.36 | Derivative-1 | 2.6 | P-4 | 15.12 | PGMEA | 71.92 | A |
| Dispersion liquid 102 | DPP-46 | 10.36 | Derivative-2 | 2.6 | P-3 | 15.12 | PGMEA | 71.92 | A |
| Dispersion liquid 103 | DPP-46 | 10.36 | Derivative-3 | 2.6 | P-3 | 15.12 | PGMEA | 71.92 | A |
| Dispersion liquid 104 | DPP-46 | 10.36 | Derivative-4 | 2.6 | P-5 | 22.68 | PGMEA | 64.36 | A |
| Dispersion liquid 105 | PR-254 | 10.36 | Derivative-1 | 2.6 | P-4 | 15.12 | PGMEA | 71.92 | B |
| Dispersion liquid 106 | PR-254 | 10.36 | Derivative-1 | 2.6 | P-4 | 11.00 | PGMEA | 71.92 | D |
| Dispersion liquid 107 | PR-264 | 10.36 | Derivative-1 | 2.6 | P-1 | 15.12 | PGMEA | 71.92 | B |
| Dispersion liquid 108 | PR-264 | 10.36 | Derivative-1 | 2.6 | P-1 | 11.00 | PGMEA | 71.92 | D |
| Dispersion liquid 109 | PR-264 | 10.36 | Derivative-1 | 2.6 | P-2 | 15.12 | PGMEA | 71.92 | C |
| Dispersion liquid 110 | PR-264 | 10.36 | Derivative-1 | 2.6 | P-2 | 11.00 | PGMEA | 71.92 | D |
| Dispersion liquid 111 | PR-264 | 10.36 | Derivative-1 | 2.6 | P-3 | 15.12 | PGMEA | 71.92 | C |
| Dispersion liquid 112 | PR-264 | 10.36 | Derivative-1 | 2.6 | P-3 | 11.00 | PGMEA | 71.92 | D |
| Dispersion liquid 113 | PR-264 | 11.36 | Derivative-1 | 2.6 | P-4 | 15.12 | PGMEA | 72.92 | B |
| Dispersion liquid 114 | PR-264 | 11.36 | Derivative-1 | 2.6 | P-4 | 11.00 | PGMEA | 72.92 | D |

The dispersion liquids 1 to 104 each including DPP-3, DPP-8, DPP-10, DPP-21, DPP-23, DPP-28, DPP-37, DPP-41, DPP-46, DPP-47, DPP-51, DPP-52, DPP-54, DPP-59, DPP-61, DPP-63, DPP-68, DPP-69, DPP-73, DPP-74, or DPP-76 as a pigment had good dispersibility.

The raw materials described in the above tables are as follows.

(Pigment)
DPP-3, DPP-8, DPP-10, DPP-21, DPP-23, DPP-28, DPP-37, DPP-41, DPP-46, DPP-47, DPP-51, DPP-52, DPP-54, DPP-59, DPP-61, DPP-63, DPP-68, DPP-69, DPP-73, DPP-74, DPP-76: Compounds described in the description of the specific examples of the pigment A.
PR-254: C. I. Pigment Red 254 (compound PR-254 having the following structure)

PR-264: C. I. Pigment Red 264 (compound PR-264 having the following structure)

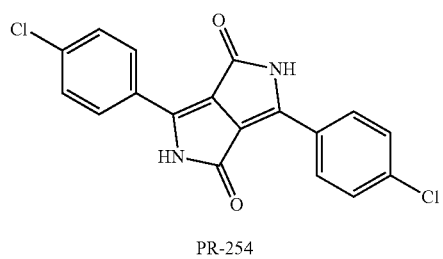

PR-254

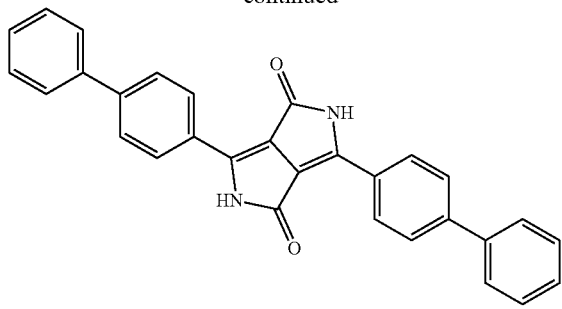

PR-264

(Pigment Derivative)
Derivative-1: Compound 1 having the following structure
Derivative-2: Compound 2 having the following structure
Derivative-3: Compound 3 having the following structure
Derivative-4: Compound 4 having the following structure (Dispersant)
P-1: A 30% by mass of propylene glycol monomethyl ether acetate (PGMEA) solution of a resin having the following structure (the numerical value described together with the main chain indicates a molar ratio, and the numerical value described together with the side chain indicates the number of repeating units, Mw=20,000)
P-2: A 30% by mass of PGMEA solution of a resin having the following structure (the numerical value described together with the main chain indicates a molar ratio, and the numerical value described together with the side chain indicates the number of repeating units, Mw=18,000)
P-3: A 30% by mass of PGMEA solution of a resin having the following structure (the numerical value described together with the main chain indicates a molar ratio, and the numerical value described together with the side chain indicates the number of repeating units, Mw=22,000)
P-4: Disperbyk-111 (manufactured by BYK Chemie)
P-5: A 20% by mass of PGMEA solution of a resin having the following structure (the numerical value described

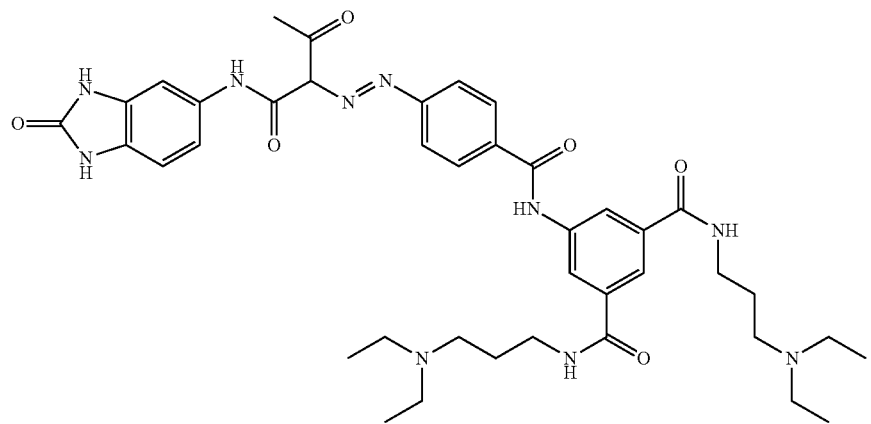

1

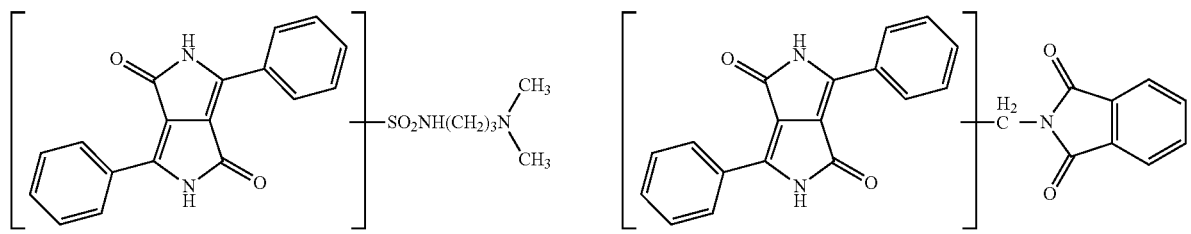

2

3

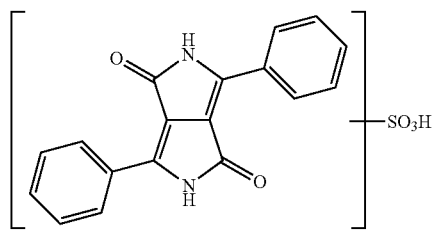

4 together with the main chain indicates a molar ratio, and the numerical value described together with the side chain indicates the number of repeating units, Mw=22,900)

PGMEA. The numerical values described in the following tables indicate parts by mass.

<Evaluation of Spectral Characteristics>

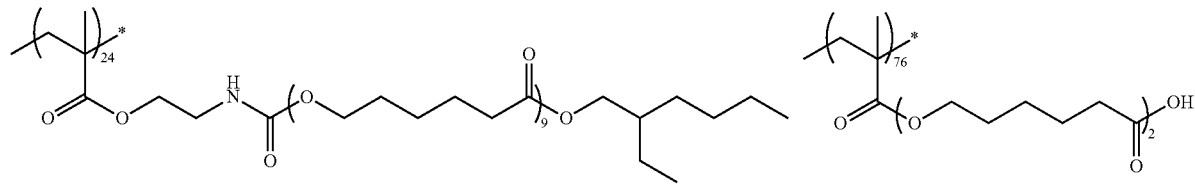

P-1

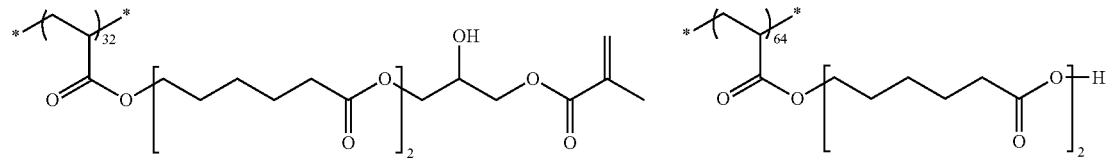

P-2

P-3

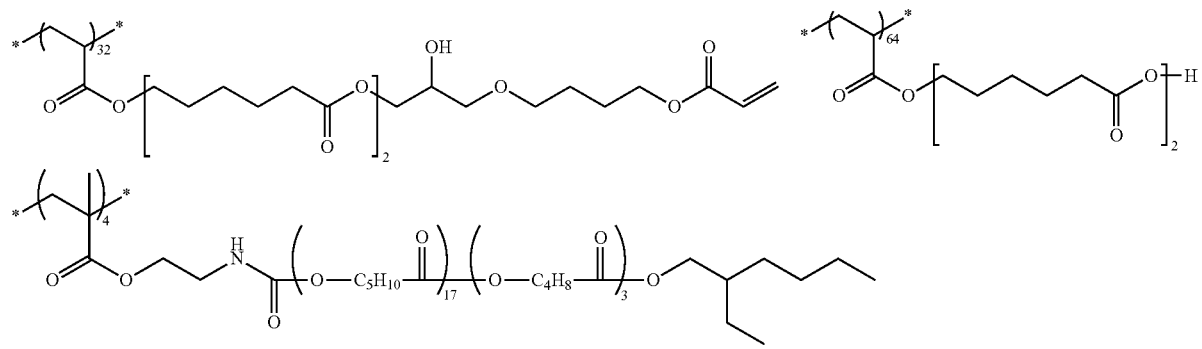

P-5

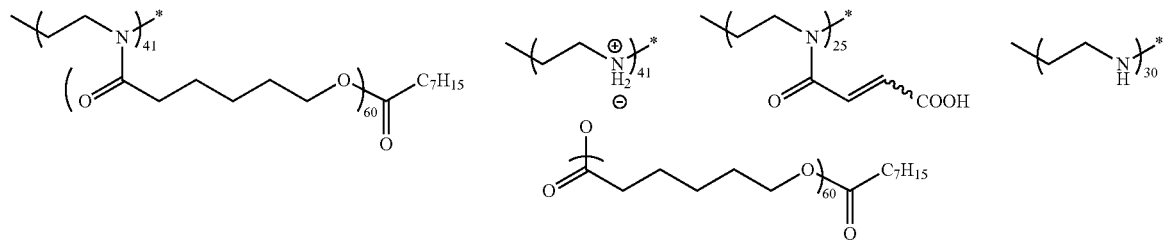

(Solvent)
PGMEA: Propylene glycol monomethyl ether acetate
PGME: Propylene glycol monomethyl ether <Preparation of Coloring Composition>
(Production Example 1)

A coloring composition was prepared by mixing the parts by mass of raw materials described in the following tables, 12.4 parts by mass of a yellow pigment dispersion liquid Y1, 4.17 parts by mass of a surfactant H1, 0.0006 parts by mass of a polymerization inhibitor 4.17 parts by mass of a surfactant H1, 0.0006 parts by mass of a polymerization inhibitor (p-methoxyphenol), and 7.66 parts by mass of Each coloring composition was applied to a glass substrate by spin coating such that the film thickness after post-baking was 0.4 μm. The coloring composition was dried by a hot plate at 100° C. for 120 seconds. Next, a heating treatment (post-baking) was performed for 300 seconds using a hot plate at 200° C. to form a cured film. Using an ultraviolet-visible near infrared spectrophotometer U-4100 (manufactured by Hitachi High-Technologies Corporation) (ref. glass substrate), the light transmittance of the glass substrate on which the cured film formed was measured in a wavelength range of 300 to 1000 nm. The spectroscopic evaluation was performed by measuring the transmittance at a wavelength of 580 nm. The lower the transmittance at a wavelength of 580 nm, the better the spectral characteristics as a red colored layer.

dried by a hot plate at 100° C. for 120 seconds to obtain a coloring composition layer.

TABLE 7

| | Red pigment dispersion liquid | | Resin | | Polymerizable monomer | | Photopolymerization initiator | | Transmittance |
|---|---|---|---|---|---|---|---|---|---|
| | Type | Parts by mass | Type | Parts by mass | Type | Parts by mass | Type | Parts by mass | (%) |
| Example 1 | Dispersion liquid 3 | 39.4 | D1 | 0.58 | E1 | 0.54 | F3 | 0.33 | 25 |
| Example 2 | Dispersion liquid 6 | 39.4 | D1 | 0.58 | E1 | 0.54 | F3 | 0.33 | 24 |
| Example 3 | Dispersion liquid 10 | 39.4 | D1 | 0.58 | E1 | 0.54 | F3 | 0.33 | 27 |
| Example 4 | Dispersion liquid 12 | 39.4 | D1 | 0.58 | E1 | 0.54 | F3 | 0.33 | 22 |
| Example 5 | Dispersion liquid 14 | 39.4 | D1 | 0.58 | E1 | 0.54 | F3 | 0.33 | 10 |
| Example 6 | Dispersion liquid 16 | 39.4 | D1 | 0.58 | E1 | 0.54 | F3 | 0.33 | 8 |
| Example 7 | Dispersion liquid 18 | 39.4 | D1 | 0.58 | E1 | 0.54 | F3 | 0.33 | 11 |
| Example 8 | Dispersion liquid 20 | 39.4 | D1 | 0.58 | E1 | 0.54 | F3 | 0.33 | 12 |
| Example 9 | Dispersion liquid 24 | 39.4 | D1 | 0.58 | E1 | 0.54 | F3 | 0.33 | 17 |
| Example 10 | Dispersion liquid 26 | 39.4 | D1 | 0.58 | E1 | 0.54 | F3 | 0.33 | 10 |
| Example 11 | Dispersion liquid 34 | 39.4 | D1 | 0.58 | E1 | 0.54 | F3 | 0.33 | 25 |
| Example 12 | Dispersion liquid 37 | 39.4 | D1 | 0.58 | E1 | 0.54 | F3 | 0.33 | 24 |
| Example 13 | Dispersion liquid 41 | 39.4 | D1 | 0.58 | E1 | 0.54 | F3 | 0.33 | 27 |
| Example 14 | Dispersion liquid 43 | 39.4 | D1 | 0.58 | E1 | 0.54 | F3 | 0.33 | 22 |
| Example 15 | Dispersion liquid 45 | 39.4 | D1 | 0.58 | E1 | 0.54 | F3 | 0.33 | 10 |
| Example 16 | Dispersion liquid 47 | 39.4 | DI | 0.58 | E1 | 0.54 | F3 | 0.33 | 8 |
| Example 17 | Dispersion liquid 49 | 39.4 | D1 | 0.58 | E1 | 0.54 | F3 | 0.33 | 11 |
| Example 18 | Dispersion liquid 51 | 39.4 | D1 | 0.58 | E1 | 0.54 | F3 | 0.33 | 12 |
| Example 19 | Dispersion liquid 55 | 39.4 | D1 | 0.58 | E1 | 0.54 | F3 | 0.33 | 17 |
| Example 20 | Dispersion liquid 57 | 39.4 | D1 | 0.58 | E1 | 0.54 | F3 | 0.33 | 10 |
| Example 21 | Dispersion liquid 65 | 39.4 | D1 | 0.58 | E1 | 0.54 | F3 | 0.33 | 25 |
| Example 22 | Dispersion liquid 68 | 39.4 | D1 | 0.58 | E1 | 0.54 | F3 | 0.33 | 24 |
| Example 23 | Dispersion liquid 72 | 39.4 | D1 | 0.58 | E1 | 0.54 | F3 | 0.33 | 27 |
| Example 24 | Dispersion liquid 74 | 39.4 | D1 | 0.58 | E1 | 0.54 | F3 | 0.33 | 22 |
| Example 25 | Dispersion liquid 76 | 39.4 | D1 | 0.15 | E1 | 0.97 | F3 | 0.33 | 10 |
| Example 26 | Dispersion liquid 76 | 39.4 | D1 | 0.58 | E1 | 0.54 | F1 | 0.33 | 10 |
| Example 27 | Dispersion liquid 76 | 39.4 | D1 | 0.58 | E1 | 0.54 | F2 | 0.33 | 10 |
| Example 28 | Dispersion liquid 76 | 39.4 | D1 | 0.58 | E1 | 0.54 | F4 | 0.33 | 10 |
| Example 29 | Dispersion liquid 76 | 39.4 | D1 | 0.58 | E1 | 0.54 | F5 | 0.33 | 10 |
| Example 30 | Dispersion liquid 76 | 39.4 | D1 | 0.58 | E2 | 0.54 | F3 | 0.33 | 10 |
| Example 31 | Dispersion liquid 76 | 39.4 | D1 | 0.58 | E3 | 0.54 | F3 | 0.33 | 10 |
| Example 32 | Dispersion liquid 76 | 39.4 | D1 | 0.58 | E4 | 0.54 | F3 | 0.33 | 10 |
| Example 33 | Dispersion liquid 76 | 39.4 | D1 | 0.58 | E5 | 0.54 | F3 | 0.33 | 10 |
| Example 34 | Dispersion liquid 76 | 39.4 | D2 | 0.58 | E5 | 0.54 | F3 | 0.33 | 10 |
| Example 35 | Dispersion liquid 78 | 39.4 | D1 | 0.58 | E1 | 0.54 | F3 | 0.33 | 10 |
| Example 36 | Dispersion liquid 80 | 39.4 | D1 | 0.58 | E1 | 0.54 | F3 | 0.33 | 10 |
| Example 37 | Dispersion liquid 81 | 39.4 | D1 | 0.58 | E1 | 0.54 | F3 | 0.33 | 8 |
| Example 38 | Dispersion liquid 83 | 39.4 | D1 | 0.58 | E1 | 0.54 | F3 | 0.33 | 9 |
| Example 39 | Dispersion liquid 85 | 39.4 | D1 | 0.58 | E1 | 0.54 | F3 | 0.33 | 12 |
| Example 40 | Dispersion liquid 89 | 39.4 | D1 | 0.58 | E1 | 0.54 | F3 | 0.33 | 17 |
| Example 41 | Dispersion liquid 91 | 39.4 | D1 | 0.58 | E1 | 0.54 | F3 | 0.33 | 9 |
| Example 42 | Dispersion liquid 97 | 39.4 | D1 | 0.58 | E1 | 0.54 | F3 | 0.33 | 10 |
| Example 43 | Dispersion liquid 98 | 39.4 | D1 | 0.58 | E1 | 0.54 | F3 | 0.33 | 8 |
| Example 44 | Dispersion liquid 100 | 39.4 | D1 | 0.58 | E1 | 0.54 | F3 | 0.33 | 17 |
| Example 45 | Dispersion liquid 101 | 39.4 | D1 | 0.58 | E1 | 0.54 | F3 | 0.33 | 9 |
| Example 46 | Dispersion liquid 102 | 39.4 | D1 | 0.58 | E1 | 0.54 | F3 | 0.33 | 10 |
| Example 47 | Dispersion liquid 104 | 39.4 | D1 | 0.58 | E1 | 0.54 | F3 | 0.33 | 10 |
| Comparative Example 1 | Dispersion liquid 105 | 39.4 | D1 | 0.58 | E1 | 0.54 | F3 | 0.33 | 30 |
| Comparative Example 2 | Dispersion liquid 107 | 39.4 | D1 | 0.58 | E1 | 0.54 | F3 | 0.33 | 35 |
| Comparative Example 3 | Dispersion liquid 109 | 39.4 | D1 | 0.58 | E1 | 0.54 | F3 | 0.33 | 35 |
| Comparative Example 4 | Dispersion liquid 113 | 39.4 | D1 | 0.58 | E1 | 0.54 | F3 | 0.33 | 35 |

As shown in the above table, the examples had a lower transmittance than the comparative examples and had preferred spectral characteristics as a red colored layer. In addition, in a case where pattern formation was performed according to the following procedures with the coloring composition of the examples by a photolithography method, pattern formability was excellent.

(Pattern Forming Method by Photolithography Method)

Each of the coloring compositions of Examples 1 to 38 was applied to a silicon wafer substrate of 8 inches (20.32 cm) by spin coating such that the film thickness after post-baking was 0.4 μm. The coloring composition was Using an i-ray stepper FPA-3000i5+ (manufactured by Canon Inc.), the coloring composition layer was irradiated with light with a wavelength of 365 nm through a mask pattern in which each of the square pixels with a side length of 1.1 μm was arranged on the substrate in a region of 4 mm×3 mm to perform exposure thereon with an exposure dose of 500 mJ/cm$^2$.

The coloring composition layer after exposure was subjected to puddle development for 60 seconds at 23° C. using a 0.3% by mass of aqueous solution of tetramethylammonium hydroxide. Thereafter, rinsing was performed by spin shower using water. Thereafter, water droplets were splashed by high-pressure air, and the silicon wafer was naturally dried. Next, post-baking was performed for 300 seconds at 220° C. using a hot plate to form a pattern.

The raw materials used for the preparation of the coloring compositions are as follows.

(Red Pigment Dispersion Liquid)
Dispersion Liquid 3, Dispersion Liquid 6, Dispersion Liquid 10, Dispersion Liquid 12, Dispersion Liquid 14, Dispersion Liquid 16, Dispersion Liquid 18, Dispersion Liquid 20, Dispersion Liquid 24, Dispersion Liquid 26, Dispersion Liquid 34, Dispersion Liquid 37, Dispersion Liquid 41, Dispersion Liquid 43, Dispersion Liquid 45, Dispersion Liquid 47, Dispersion Liquid 49, Dispersion Liquid 51, Dispersion Liquid 55, Dispersion Liquid 57, Dispersion Liquid 65, Dispersion Liquid 68, Dispersion Liquid 72, Dispersion Liquid 74, Dispersion Liquid 76, Dispersion Liquid 78, Dispersion Liquid 80, Dispersion Liquid 81, Dispersion Liquid 83, Dispersion Liquid 85, Dispersion Liquid 89, Dispersion Liquid 91, Dispersion Liquid 97, Dispersion Liquid 98, Dispersion Liquid 99, Dispersion Liquid 100, Dispersion Liquid 101, Dispersion Liquid 102, Dispersion Liquid 104, Dispersion Liquid 105, Dispersion Liquid 107, Dispersion Liquid 109, Dispersion Liquid 113: The dispersions described above (Yellow Pigment Dispersion Liquid Y1)
A yellow pigment dispersion liquid Y1 prepared by the following method 10.81 parts by mass of C. I. Pigment Yellow 139, 1.5 parts by mass of the derivative-1, 3.78 parts by mass of a dispersant P-6 (a resin having the following structure), and 83.87 parts by mass of PEGMA were mixed. Thereafter, 230 parts by mass of zirconia beads having a diameter of 0.3 mm were added thereto to perform a dispersion treatment for 5 hours using a paint shaker, and the beads were separated by filtration to produce a yellow pigment dispersion liquid Y1.

Dispersant P-6: A 30% by mass of PGMEA solution of a resin having the following structure (the numerical value described together with the main chain indicates a molar ratio, and the numerical value described together with the side chain indicates the number of repeating units, Mw=24,000)

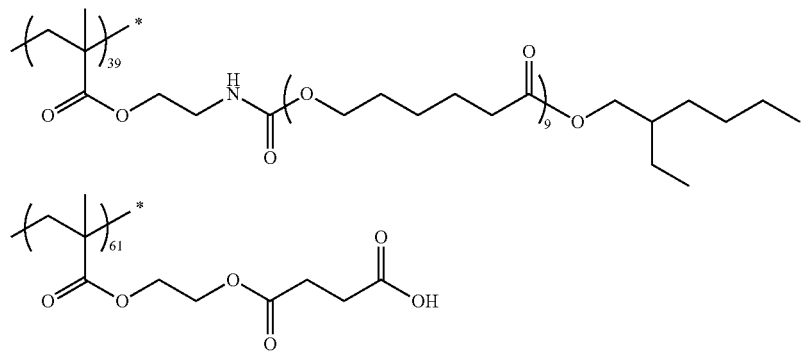

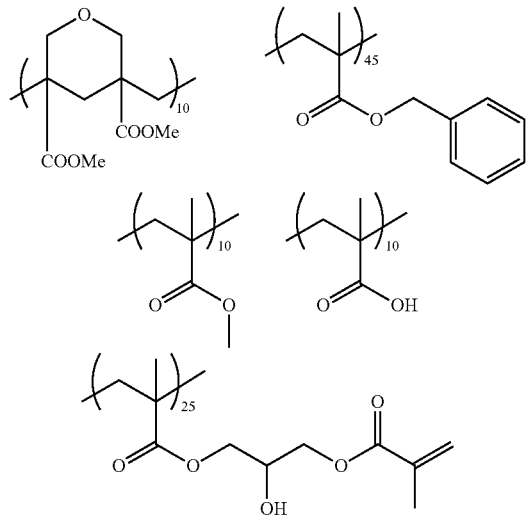

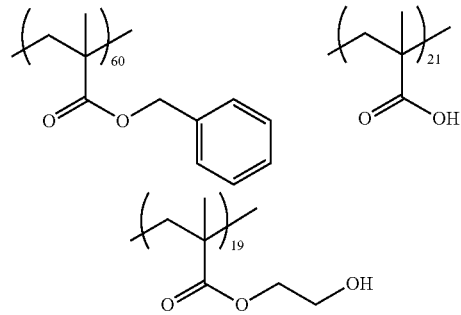

(Polymerizable Monomer)
E1: KAYARAD DPHA (manufactured by Nippon Kayaku Co., Ltd.)
E2: Aronix M-305 (manufactured by TOAGOSEI CO., LTD.)

(Resin)
D1: A 40% by mass of PGMEA solution of a resin having the following structure (the numerical value described together with the main chain indicates a molar ratio, Mw=11,000)
D2: A 40% by mass of PGMEA solution of a resin having the following structure (the numerical value described together with the main chain indicates a molar ratio, Mw=14,000)

E3: NK ester A-TMMT (manufactured by Shin-Nakamura Chemical Co., Ltd.)
E4: KAYARAD RP-1040 (manufactured by Nippon Kayaku Co., Ltd.)
E5: Aronix TO-2349 (manufactured by TOAGOSEI CO., LTD.)

(Photopolymerization Initiator)
F1: IRGACURE-OXE01 (manufactured by BASF)
F2: IRGACURE-OXE02 (manufactured by BASF)

F3: A compound having the following structure

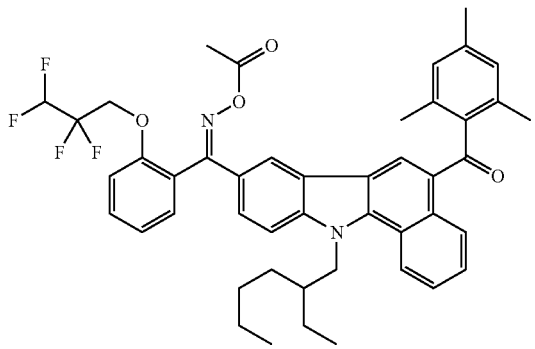 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

F4: IRGACURE 369 (manufactured by BASF)
F5: A compound having the following structure

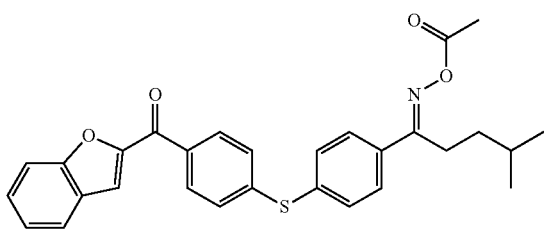 [SMILES: CC(=O)O/N=C(\CCC(C)C)c1ccc(Sc2ccc(C(=O)c3cc4ccccc4o3)cc2)cc1]

(Surfactant)
H1: A 1% by mass of PGMEA solution of the following mixture (Mw=14,000) (in the following formula, % representing the proportion of the repeating unit is % by mole)

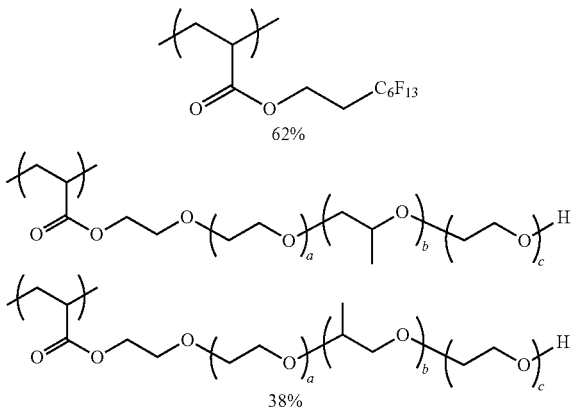

a + c = 14
b = 17

<Preparation of Coloring Composition>

Production Example 2

70.8 parts by mass of the dispersion liquid 14 as a red pigment dispersion liquid, 18.9 parts by mass of the yellow pigment dispersion liquid Y1, 2.6 parts by mass of an epoxy compound EP 1, 2.7 parts by mass of a surfactant H2, and 50 parts by mass of PGMEA were mixed to prepare a coloring composition 101.

(Epoxy Compound)
EP1: A 1,2-epoxy-4-(2-oxiranyl)cyclohexane adduct of 2,2-bis(hydroxymethyl)-1-butanol (manufactured by Daicel Corporation, EHPE3150, Mw 23,000)
(Surfactant)
H2: A 0.2% by mass of cyclohexanone solution of the following mixture (Mw=14,000) (in the following formula, % representing the proportion of the repeating unit is % by mole)

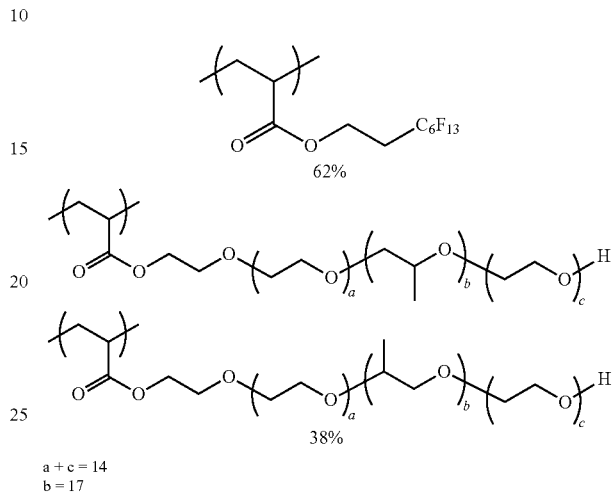

a + c = 14
b = 17

<Evaluation of Spectral Characteristics>

The obtained coloring composition 101 was applied to a glass substrate by spin coating such that the film thickness after post-baking was 0.4 μm. The coloring composition was dried by a hot plate at 100° C. for 120 seconds. Next, a heating treatment (post-baking) was performed for 300 seconds using a hot plate at 200° C. to form a cured film. Using an ultraviolet-visible near infrared spectrophotometer U-4100 (manufactured by Hitachi High-Technologies Corporation) (ref. glass substrate), the light transmittance of the glass substrate on which the cured film formed was measured in a wavelength range of 300 to 1000 nm. The transmittance at a wavelength of 580 nm was 10%.

<Pattern Formation by Dry Etching Method>

The coloring composition 101 was applied to a silicon wafer substrate of 8 inches (20.32 cm) by spin coating such that the film thickness after post-baking was 0.4 μm. The coloring composition was dried by a hot plate at 100° C. for 120 seconds. Next, a heating treatment (post-baking) was performed for 300 seconds using a hot plate at 200° C. to form a colored layer.

Next, a positive type photoresist (FHi622BC, manufactured by FUJIFILM Electronic Materials Co., Ltd.) was applied to the colored layer and dried by a hot plate at 100° C. for 120 seconds to form a photoresist layer having a film thickness of 0.8 μm.

Next, a heating treatment was performed for 1 minute at a temperature at which the temperature of the photoresist layer was increased to 90° C. Then, a development treatment was performed for 1 minute using a developer (FHD-5, manufactured by FUJIFILM Electronic Materials Co., Ltd.), and then post-baking was performed for 1 minute at 110° C. to form a mask.

Next, dry etching was performed according to the following procedures.

A first etching treatment was performed for 80 seconds under the conditions of RF (high frequency) power: 800 W, antenna bias: 400 W, wafer bias: 200 W, internal pressure of chamber: 4.0 Pa, substrate temperature: 50° C., and gas kind and flow rate of mixed gas: $CF_4$=80 mL/min, $O_2$=40 mL/min, Ar=800 mL/min with a dry etching apparatus (U-621, manufactured by Hitachi High-Technologies Corporation).

Next, a second etching treatment was performed for 28 seconds under the conditions of RF power: 600 W, antenna bias: 100 W, wafer bias: 250 W, internal pressure of chamber: 2.0 Pa, substrate temperature: 50° C., and gas kind and flow rate of mixed gas: $N_2$=500 mL/min, $O_2$=50 mL/min, Ar=500 mL/min ($N_2/O_2/Ar$=10/1/10 (flow ratio)) with the same dry etching apparatus.

After performing the dry etching under the above conditions, a peeling treatment was performed for 120 seconds using a photoresist peeling liquid (MS230C, manufactured by FUJIFILM Electronic Materials Co., Ltd.) to remove the resist, and then washing with pure water and spin drying were performed. Thereafter, a dehydration baking treatment was performed at 100° C. for 2 minutes. Thereby, a pattern was formed. The coloring composition exhibited good pattern formability in the dry etching method.

What is claimed is:

1. A coloring composition comprising:
   a resin which includes a repeating unit having an acid group, the acid value of the resin being 30 to 200 mgKOH/g,
   a pigment A having a structure in which an aromatic ring group in which a group bonded with an oxygen atom, a sulfur atom, or a nitrogen atom is introduced to an aromatic ring is bonded to a diketopyrrolopyrrole skeleton; and
   a compound having a curable group,
   wherein the content of the pigment A in the total solids content of the coloring composition is 40% by mass or more,
   the coloring composition comprises a pigment derivative which is a compound having a structure in which a part of a chromophore which is a benzimidazolone-based skeleton or a diketopyrrolopyrrole-based skeleton is substituted with an acid group, a basic group, or a phthalimidemethyl group,
   the content of the pigment derivative is 1 to 30 parts by mass with respect to 100 parts by mass of the pigment A, and
   the pigment A is a compound represented by Formula (1),

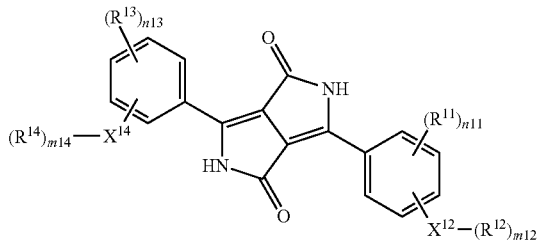

(1)

in the formula, $R^{11}$ and $R^{13}$ each independently represents a substituent,
$R^{12}$ and $R^{14}$ each independently represents a hydrogen atom, an alkyl group, an aryl group, or a heteroaryl group,
n11 and n13 each independently represents an integer of 0 to 4,
$X^{12}$ and $X^{14}$ each independently represents an oxygen atom, a sulfur atom, or a nitrogen atom,
in a case where $X^{12}$ represents an oxygen atom or a sulfur atom, m12 represents 1, and in a case where $X^{12}$ represents a nitrogen atom, m12 represents 2, and
in a case where $X^{14}$ represents an oxygen atom or a sulfur atom, m14 represents 1, and in a case where $X^{14}$ represents a nitrogen atom, m14 represents 2.

2. The coloring composition according to claim 1, wherein the pigment A is a compound represented by Formula (2),

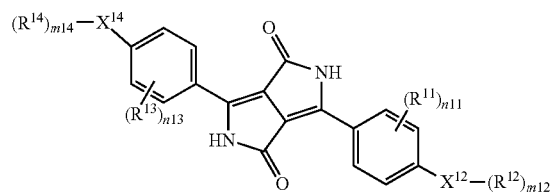

(2)

in the formula, $R^{11}$ and $R^{13}$ each independently represents a substituent,
$R^{12}$ and $R^{14}$ each independently represents a hydrogen atom, an alkyl group, an aryl group, or a heteroaryl group,
n11 and n13 each independently represents an integer of 0 to 4,
$X^{12}$ and $X^{14}$ each independently represents an oxygen atom, a sulfur atom, or a nitrogen atom,
in a case where $X^{12}$ represents an oxygen atom or a sulfur atom, m12 represents 1, and in a case where $X^{12}$ represents a nitrogen atom, m12 represents 2, and
in a case where $X^{14}$ represents an oxygen atom or a sulfur atom, m14 represents 1, and in a case where $X^{14}$ represents a nitrogen atom, m14 represents 2.

3. The coloring composition according to claim 1, wherein the compound having a curable group includes at least one compound selected from a compound having an ethylenically unsaturated group and a compound having an epoxy group.

4. The coloring composition according to claim 1, wherein the compound having a curable group includes a resin having an ethylenically unsaturated group.

5. The coloring composition according to claim 1, wherein the compound having a curable group includes a compound having an ethylenically unsaturated group and further includes a photopolymerization initiator.

6. The coloring composition according to claim 1, further comprising:
   a monomer having an ethylenically unsaturated group; and
   a resin,
   wherein a ratio M1/B1 of the mass M1 of the monomer having an ethylenically unsaturated group contained in the coloring composition to the mass B1 of the resin contained in the coloring composition is 0.2 or less.

7. A cured film obtained from the coloring composition according to claim 1.

8. A pattern forming method comprising:
   forming a coloring composition layer on a support using the coloring composition according to claim 1; and
   forming a pattern onto the coloring composition layer by a photolithography method or a dry etching method.

9. A color filter comprising the cured film according to claim 7.

10. A solid-state imaging element comprising the cured film according to claim 7.

11. An image display device comprising the cured film according to claim 7.

12. The coloring composition according to claim 1, wherein
the coloring composition comprises a graft resin including a repeating unit having a poly(meth)acrylate structure as a main chain and having a graft chain of a polyester structure in a side chain.

13. The coloring composition according to claim 1, wherein
the coloring composition comprises a yellow colorant, and
the content of the yellow colorant is 1 to 40 parts by mass with respect to 100 parts by mass of the pigment A.

14. The coloring composition according to claim 1, wherein
the coloring composition comprises a yellow colorant, and
the content of the yellow colorant is 1 to 40 parts by mass with respect to 100 parts by mass of the pigment A.

15. The coloring composition according to claim 1, wherein
the coloring composition comprises a yellow colorant,
the content of the yellow colorant is 1 to 40 parts by mass with respect to 100 parts by mass of the pigment A, and
the total content of the pigment A and the yellow colorant is 55% to 90% by mass with respect to the total solids content of the coloring composition.

\* \* \* \* \*